(12) United States Patent
Ihara et al.

(10) Patent No.: US 7,088,401 B1
(45) Date of Patent: Aug. 8, 2006

(54) LIQUID CRYSTAL DISPLAY DEVICE WITH LESS PIXEL ERROR AND METHOD OF MANUFACTURING THE SAME

(75) Inventors: Hirofumi Ihara, Tokyo (JP);
Wakahiko Kaneko, Tokyo (JP);
Takayasu Iida, Tokyo (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 380 days.

(21) Appl. No.: 09/609,169

(22) Filed: Jun. 30, 2000

(30) Foreign Application Priority Data

Jun. 30, 1999 (JP) ................................ 11-186710

(51) Int. Cl.
*G02F 1/1343* (2006.01)
*G02F 1/136* (2006.01)
*G02F 1/1333* (2006.01)
*H01L 29/04* (2006.01)

(52) U.S. Cl. ............................ 349/39; 349/38; 349/42; 349/138; 257/72

(58) Field of Classification Search .................. 349/38, 349/39, 42, 43, 122, 138, 142; 257/72
See application file for complete search history.

(56) References Cited

U.S. PATENT DOCUMENTS

| | | | | |
|---|---|---|---|---|
| 5,757,453 A | * | 5/1998 | Shin et al. | |
| 5,940,151 A | * | 8/1999 | Ha | 349/43 |
| 6,243,146 B1 | * | 6/2001 | Rho et al. | 349/42 |
| 6,278,502 B1 | * | 8/2001 | Colgan et al. | 349/38 |
| 6,317,173 B1 | * | 11/2001 | Jung et al. | |
| 6,512,504 B1 | * | 1/2003 | Yamauchi et al. | 345/87 |
| 6,531,713 B1 | * | 3/2003 | Yamazaki | 257/59 |

FOREIGN PATENT DOCUMENTS

| | | |
|---|---|---|
| JP | 2-67523 | 3/1990 |
| JP | 04-174822 | 6/1992 |
| JP | 6-347827 | 12/1994 |
| JP | 8-234234 | 9/1996 |
| JP | 9-15644 | 1/1997 |
| JP | 10-48664 | 2/1998 |
| JP | 10-339885 | 12/1998 |
| JP | 11-38439 | 2/1999 |
| KR | 1992-0008523 | 10/1990 |

OTHER PUBLICATIONS

Korean Office Action dated Apr. 30, 2002 with partial translation.
Japanese Office Action dated Sep. 3, 2002 with partial translation.

* cited by examiner

*Primary Examiner*—Tarifur R. Chowdhury
(74) *Attorney, Agent, or Firm*—McGinn IP Law Group, PLLC

(57) ABSTRACT

A liquid crystal display device includes first and second electrodes and an insulating film. The first electrode is formed on a substrate as one of two electrodes of an accumulation capacitor and applied with a voltage. The insulating film is formed on the first electrode to cover the first electrode. The second electrode is formed on the first electrode via the insulating film as the other electrode of the accumulation capacitor and including a first conductive film and a second conductive film formed on the first conductive film.

20 Claims, 19 Drawing Sheets

LIQUID CRYSTAL DISPLAY DEVICE WITH LESS PIXEL ERROR AND METHOD OF MANUFACTURING THE SAME

BACKGROUND OF THE INVENTION

1. Field of the Invention

The present invention relates to an active matrix type of a liquid crystal display device using a thin film transistor and a method of manufacturing the same.

2. Description of the Related Art

In recent years, a display device having a larger screen and higher fineness is requested in order to miniaturize and lighten a personal computer and a word processor. For this purpose, an active matrix type of a liquid crystal display device is generally used. In this display device, a semiconductor thin film transistor is formed on a transparent insulation substrate as an actively switching element.

For example, a liquid crystal display device is used which has a configuration as shown in FIG. 1. FIG. 1 is a plan view showing a liquid crystal display device. A color filter substrate CB is placed in an upper portion of a TFT substrate K shown in FIG. 1 although it is omitted here. The circuit structure of the liquid crystal display device will be described below with reference to FIG. 2. FIG. 2 is an equivalent circuit to the liquid crystal display device of FIG. 1.

In FIG. 2, semiconductor thin film transistors TR11 to TRnm are respectively formed in the vicinities of respective intersections of respective data lines D1 to Dm and data selection lines S1 to Sn in order to drive respective pixels in the liquid crystal display device. The data lines D1 to Dm are connected to respective drain terminals of the thin film transistors TR11 to TR1m, . . . , and TRn1 to TRnm. The pixels $C_G$ are connected to respective sources of the thin film transistors TR11 to TRnm. Display data signals D1 to Dm are supplied to columns of the respective pixels $C_G$ from an external drive IC (Integrated Circuit) (not shown) to the data lines D1 to Dm through respective terminals TD1 to TDm. Also, selection signals are supplied from an external drive IC (not shown) to the data selection lines S1 to Sn through respective terminals TG1 to TGn. Thus, one of the thin film transistors is selected for each of the columns of the pixels $C_G$. At this time, the liquid crystal display device sequentially enters the display data signals to the respective data lines D1 to Dm at predetermined timings. Also, the data selection signals are sequentially supplied to the data selection lines S1 to Sn in response to those timings to turn on the thin film transistors TR11 to TR1m, . . . , and TRn1 to TRnm.

Thus, predetermined charges corresponding to the display data signals are accumulated in capacitors $C_G$ as the pixels from the respective data lines D1 to Dm through the respective thin film transistors TR11 to TRnm. The pixel capacitor $C_G$ is formed of a pixel electrode, a counter electrode and a liquid crystal layer between them. The counter electrode is formed in the color filter substrate CB (not shown) and is set to a predetermined potential Va. Here, the pixel electrode implies a pattern of a transparent electrode 12 formed in an area of the pixel $C_G$.

However, the charge accumulated in the pixel capacitor $C_G$ is gradually naturally discharged and reduced. Thus, a potential difference between the pixel electrode and the counter electrode is dropped so that an orientation of each of molecules of the liquid crystal can not be kept at a predetermined position until a next accumulation of charges is carried out. That is, this results in the occurrence of variation of a display intensity in which the display becomes extremely dark or bright. For this reason, respective accumulation capacitor elements C11 to Cnm are provided in parallel with the pixel capacitors $C_G$ in order to compensate the discharged charges. Also, a predetermined voltage is applied through respective terminals TG2 to TGn and the electrodes TC from the drive ICs (not shown) to the other terminal opposite to a terminal connected to the pixel capacitor $C_G$ in each of the accumulation capacitor elements C11 to Cnm.

Next, a method for manufacturing the liquid crystal display device will be described below with reference to FIGS. 3A to 3E. This method is disclosed in Japanese Laid Open Patent Application (JP-A-Heisei 10-48664). FIGS. 3A to 3E show the cross sectional views of the liquid crystal display device taken on a line A—A in FIG. 1.

In FIG. 3A, a chrome layer MT1 is deposited on a surface of a transparent glass substrate 1 by use of a technique such as a sputtering or CVD (Chemical Vapor Deposition) method. Subsequently, a resist pattern (not shown) is formed in an area for patterns such as a gate electrode on the surface of the conductive layer MT1 are formed by use of a typical photolithography technique. Then, the conductive layer MT1 is etched by use of the resist pattern (not shown) as a mask. Thus, a terminal pattern 2, a gate electrode pattern 3 and a gate bus line pattern 4 are formed. Here, the gate electrode pattern 3 implies a pattern area formed to protrude from the gate bus line pattern 4 and acts as the gate electrode of the thin film transistor (each of the thin film transistors TR11 to TRnm), as shown in FIG. 1.

Next, in FIG. 3B, a gate insulating film 5 is formed as a layer of silicon nitride film on the transparent glass substrate 1. Then, an i-type (intrinsic type) a-Si (amorphous silicon) layer 6 and an $n^+$ type a-Si layer 7 for the thin film transistor (each of the thin film transistors TR11 to TRnm in FIG. 1) are laminated above the surface of the gate insulating film 5. Next, a resist pattern (not shown) is formed in the area for the thin film transistor on the surface of the $n^+$ type a-Si layer 7 by use of the typical photolithography technique. Then, the a-Si layer 6 and the $n^+$ type a-Si layer 7 are etched by use of the resist pattern (not shown) as a mask. Thus, the a-Si layer 6 and the $n^+$ type a-Si layer 7 are formed for the pattern of the thin film transistor.

Next, in FIG. 3C, a chrome layer (conductive layer) MT2 is deposited on the surface of the $n^+$ type a-Si layer 7 and the surface of the gate insulating film 5 by use of a sputtering method or a CVD method. The chrome layer MT2 is a drain electrode and source electrode of the thin film transistor and is the second electrode 10 as another terminal of an accumulation capacitor element (each of the accumulation capacitor elements C11 to Cnm).

Next, a resist patterns (not shown) is formed in the areas for the second electrode 10 of the accumulation capacitor element and for the drain and source electrodes of the thin film transistor on the surface of the conductive layer MT2 by use of the typical photolithography technique. Then, the conductive layer MT2 is etched by use of the resist pattern (not shown) as a mask. Thus, a drain electrode 8 and a source electrode 9 are formed in the positions of the patterns of the drain and the source in the thin film transistor, respectively. Also, the second electrode 10 is formed in the position of the terminal pattern of the accumulation capacitor element. After that, the drain electrode 8 and the source electrode 9 are used as a mask to remove the $n^+$ type a-Si layer 7 remaining on the channel area of each of the thin film transistors TR11 to TRnm.

Next, as shown in FIG. 3D, a protective insulating film 11 is deposited on the surfaces of the drain electrode 8, source electrode 9 and second electrode 10 and the surface of the gate insulating film 5 by use of a sputtering method and a CVD method. Subsequently, a resist pattern (not shown) is formed for contact holes CT in the protective insulating film 11 by use of the typical photolithography technique. Then, the resist pattern (not shown) is used as a mask to etch the protective insulating film 11. Thus, openings for the contact hole CT are formed at the predetermined positions of the protective insulating film 11. At this time, the gate insulating film 5 is etched in the terminal 2 in addition to the protective insulating film 11. Hence, the surface of the terminal 2 is exposed.

Next, as shown in FIG. 3E, a transparent conductive layer such as an ITO (Indium Tin Oxide) layer 12 is formed on the surface of the protective insulating film 11, the surface of the terminal pattern 2 exposed through the contact hole CT, the surface of the pattern of the source electrode 9 exposed through the contact hole CT, and the surface of the gate bus line pattern 4 exposed through the contact hole CT by use of a sputtering method. A resist pattern (not shown) is formed for predetermined areas of the conductive layer 12 serving as a wiring patterns and a pixel electrode by use of the typical photolithography technique. The conductive layer 12 is etched by use of the resist pattern (not shown) as a mask. Thus, the pixel electrode (pattern of the conductive layer 12 on the pixel $C_G$) is formed of the conductive layer 12, and the pixel electrode and the second electrode 10 are connected to each other through the contact hole CT. The TFT (Thin Film Transistor) array substrate is completed by the above-mentioned processes.

In this way, each of the accumulation capacitor elements C11 to Cnm is formed of the gate bus line pattern 4 (constituted of the metal layer MT1), the gate insulating film 5 and the second electrode 10. If there is no accumulation capacitor element, the pixel capacitor must be formed to have larger capacitance. However, since the protective insulating film 11 is added, the capacitance value can not be made larger.

Next, in FIG. 4 (the portion of the terminal pattern 2 is omitted), an orientation film 13 made of material such as polyimide resin, is coated on the surface of the protective insulating film 11 and the surface of the wiring pattern of the conductive layer 12. Then, the surface of the orientation film 13 is rubbed with a roller (a rubbing process), such that the molecules of the liquid crystal are oriented on the surface of the orientation film.

Similarly, the color filter substrate CB is produced to be placed on the glass substrate 1. Here, the color filter substrate CB is formed on the surface of a glass substrate 20, and a black matrix layer 21 is made of metal material such as CR. Then, a coloration film 22 is laminated on the surface on the black matrix layer 21. Next, a counter electrode layer 23 having a transparent conductive layer such as an ITO layer is laminated on the surface of the coloration film 22. Then, an orientation film 24 made of material such as polyimide resin, is coated on the surface of the counter electrode 23. Then, the surface of the orientation film 24 is rubbed with a roller (the rubbing process) so that the molecules of the liquid crystal are oriented on the surface of the orientation film 24.

The TFT substrate K and the color filter substrate CB are fit to each other through a spacer with a predetermined distance so that the orientation films 13, 24 face each other. Next, liquid crystal 14 is injected into the gap between the TFT substrate K and the color filter substrate CB and the gap between the TFT substrate K and the color filter substrate CB is sealed. Next, a polarization plate 15 and a polarization plate 25 are fit on a rear surface of the glass substrate 1 and a rear surface of the glass substrate 20, respectively. Then, a drive circuit and a body are added to complete the liquid crystal display device.

However, in the above-mentioned liquid crystal display device, there is a case where a short-circuited defect is induced between the pixel electrode and a first electrode of the accumulation capacitor element (the gate bus line pattern 4 in this case) in a process for manufacturing the element. The mechanism of the occurrence of the short-circuited defect in the manufacturing process will be described below with reference to FIGS. 5A to 5F. FIGS. 5A to 5F show cross sectional views of the liquid crystal display device taken on a line B—B in FIG. 1.

In the process shown in FIG. 3A, it is supposed that when the conductive layer MT2 is deposited on the surface of the gate insulating film 5, a film formation defect FA1 is induced in the conductive layer MT2 on the upper portion of the gate bus line pattern 4 because of dust on the film surface, as shown in FIG. 5A. Then, a photo-resist R1 for the second electrode 10 is formed by use of the photolithography technique, as shown in FIG. 5B. Thus, the conductive layer MT2 is etched with the photo-resist R1 as a mask. Hence, when the resist R1 is removed, the shape shown in FIG. 5C is provided. Subsequently, as shown in FIG. 5D, the protective insulating film 11 is deposited on the surface of the second electrode 10 and the surface of the gate insulating film 5. Next, a photo-resist R2 is coated on the surface of the protective insulating film 11. A pattern for a contact hole CT is formed to the photo-resist R2 by use of the photolithography technique. Thus, the protective insulating film 11 is etched by use of the photo-resist R2 as a mask. Hence, when the resist R2 is removed, the shape shown in FIG. 5E is formed.

However, at this time, thicknesses to be etched are different between the portion of the terminal pattern 2 and the accumulation capacitor element, as can be seen from FIG. 3D. That is, if only the protective insulating film 11 is etched in the portion of the second electrode 10, the surface of the second electrode 10 is exposed. However, it is necessary to etch both of the protective insulating film 11 and the gate insulating film 5 in the portion of the terminal pattern 2. For the reason, an etching time period in which the protective insulating film 11 and the gate insulating film 5 can be sufficiently removed is set. As a result, if there is no film formation defect FA1 in the second electrode 10, the second electrode 10 acts as a stopper so that the etching does not proceed. However, if there is the film formation defect FA1, the etching proceeds up to the gate bus line 4. Thus, a film formation defect FA2 is induced in the gate insulating film 5 as shown in FIG. 5E.

In FIG. 5F, when the pattern of the conductive layer 12 is formed, the second electrode 10 and the gate bus line 4 are short-circuited through the film formation defect FA2. As a result, if the second electrode 10 and the gate bus line 4 are short-circuited in the accumulation capacitor element C11 in FIG. 1, the thin film transistor TR11 is turned on. Even if the charge is injected into the pixel $C_G$, a voltage of the pixel $C_G$ is always equal to that of the gate bus line 4. This is because the path of charge is formed from the second electrode 10 of the accumulation capacitor element C11 to the gate bus line 4. As a result, the pixel $C_G$ having the short-circuited defect is recognized as a point defect, which drops a display device quality.

In order to prevent the short-circuited defect from being induced, it is enough to etch the gate insulating film 5 after masking the portion other than the terminal pattern 2, after etching only the protective insulating film 11. However, the not only a mask increase by 1, but also the second electrode 10 exposed in the contact hole CT is contaminated. Thus, a contact resistance in the contact hole CT is increased so that the charge can not be sufficiently charged to the accumulation capacitor element. Hence, the etching process is carried out by use of the same mask for the protective insulating film 11 and the gate insulating film 5.

If there is a defect in the photo-resist R1 serving as a mask of the etching even though any defect is not induced when the conductive layer MT2 is formed, the short-circuited defect is induced between the second electrode 10 and the gate bus line 4, similarly to the above-mentioned case. This short-circuited defect will be described below with reference to FIGS. 6A to 6C. FIGS. 6A to 6C show cross section views of the liquid crystal display device taken on the line B—B in FIG. 1.

For example, in FIG. 3A, it is supposed that the conductive layer MT2 is deposited on the surface of the gate insulating film 5 to thereby provide the structure shown in FIG. 6A. Then, a photo-resist R1 for a second electrode 10 is formed by use of the photolithography technique as shown in FIG. 6B. At this time, it is supposed that a resist defect FR1 is induced in which a babble is mixed in the photo-resist R1. As a result, the conductive layer MT2 is etched by use of the photo-resist R1 as a mask. Thus, when the photo-resist R1 is removed, the shape shown in FIG. 6C is formed. At this time, the conductive layer MT2 is etched by use of the photo-resist R1 having the resist defect FR1 as a mask. Thus, the film defect FA3 is induced in the conductive layer MT2, similarly to the case of FIG. 5C. The occurrence of the short-circuited defect between the second electrode 10 and the gate bus line pattern 4 is similar to the description in FIGS. 5D to 5F except that the film formation defect FA1 is replaced by the film defect FA3. Accordingly, the description thereof is omitted.

In order to avoid the above-mentioned problems, the countermeasure in which the position of the contact hole CT in the second electrode 10 is displaced from the first electrode of the accumulation capacitor element is considered, as shown in Japanese Laid Open Patent Application (JP-A-Heisei, 9-15644). The structure of the above-mentioned liquid crystal display device will be described below with reference to FIG. 7. FIG. 7 is a partial expanded plan view of a portion of one pixel in a liquid crystal display device as another conventional example. In FIG. 7, an accumulation capacitor element (each of the accumulation capacitor elements C11 to Cnm) is formed between a second electrode 10 (an auxiliary electrode) and a common potential line pattern 40 separately from the gate bus line pattern 4 of the liquid crystal display device in the above conventional example. The common potential line-pattern 40 is formed on the same conductive layer as the gate bus line pattern 4 in the conventional example. Accordingly, the process is same. In the way, there are two kinds in the structure of the accumulation capacitor element. That is, one is the accumulation capacitor element formed of the gate bus line pattern 4 and the second electrode 10 in the liquid crystal display device as shown in FIG. 1. The other is the accumulation capacitor element formed of the common potential line pattern 40 and the second electrode 10.

The structure of the liquid crystal display device shown in FIG. 7 will be described below. Here, the structure of the thin film transistor TR is similar to those of the thin film transistors TR11 to Trnm shown in FIG. 1. Thus, the description thereof is omitted. Accordingly, the structure of the accumulation capacitor elements C11 to Cnm will be described below with reference to FIG. 8 showing a cross sectional view of the liquid crystal display device taken on along the line C—C in FIG. 7.

In FIG. 8, a common potential line pattern 40 is formed on a surface of an insulation substrate 1, and a gate insulating film 5 is formed on the surface of the insulation substrate 1 and the surface of the common potential line pattern 40. Then, an a-Si layer 6, an $n^+$ type a-Si layer 7 and a second electrode 10 are formed as a stack structure, in order to form an accumulation capacitor element C11 at a gate bus line pattern 4. That is, the a-Si layer 6, the $n^+$ type a-Si layer 7 and the conductive layer MT2 are sequentially laminated. Then, these layers are formed through once etching process by use of the photo-resist as the mask for forming a counter electrode. Subsequently, a contact hole CT is formed, and a wiring pattern of a conductive layer 12 is formed by the above-mentioned processes. If there is a defect in a photo-resist serving as a mask for forming the counter electrode, a film defect is induced which penetrates the respective layers of the a-Si layer 6, the $n^+$ type a-Si layer 7 and the second electrode 10 for the counter electrode. However, the short-circuited defect is never induced between the second electrode 10 of the conductive layer 12 and the first electrode of the accumulation capacitor element, even if a gate insulating film 5 over-etched when the contact hole CT is formed in the terminal pattern 2 in FIG. 1. This is because the first electrode (the common potential line pattern 40 in the case) of the accumulation capacitor element is displaced from the contact hole CT. However, an aperture rate of a pixel $C_G$ is reduced on the basis of an area of a portion in which the second electrode 10 is displaced into an outer portion of the first electrode of the accumulation capacitor element.

This reason is as follows. That is, in the case of FIG. 1, the contact hole CT is located above the gate bus line pattern 4, and the gate bus line pattern 4 is opaque. Therefore, even if the contact hole CT is formed, the aperture rate is never reduced. However, in the case of FIG. 7, the contact hole CT is displaced so as not to be located at the upper portion of the first electrode of the accumulation capacitor element. Thus, the area of the opaque portion is increased, and the aperture rate is reduced. As a result, the display intensity of the pixel is reduced. Hence, it is desirable that the contact between the second electrode 10 of the accumulation capacitor element and the pixel electrode is formed at the upper portion of the first electrode of the accumulation capacitor element so as not to reduce the aperture rate.

Also, in the accumulation capacitor elements C11 of FIG. 8 (the accumulation capacitor elements C12 to Cnm), the a-Si layer 6 and the $n^+$ type a-Si layer 7 exist in the entire lower portion of the second electrode 10. Thus, a considerable portion acts as an MIS (Metal-Insulator-Semiconductor) capacitor having an MIS structure. Hence, a capacitance value is smaller as compared with the area.

In conjunction with the above description, an active matrix type liquid crystal display device is disclosed in Japanese Laid Open Patent Application (JP-A-Heisei 10-339885). In this reference, a metal layer CstDM is disposed in a protection film PAS and a gate insulating film put between a transparent pixel electrode ITO and a previous stage scanning signal line layer GM. The metal layer CstDM is formed of the same material as an image signal line. Thus, the effective distance between capacitor electrodes can be reduced and the capacitance can be made large without widening the area.

Also, an active matrix type liquid crystal display device is disclosed in Japanese Laid Open Patent Application (JP-A-

Heisei 11-38439). In this reference, a pixel electrode 111 is formed on surface protection film deposited on a TFT 100. A capacitor electrode 112 is formed on the same layer as the TFT 100 to be electrically connected to a pixel electrode 111 through a via-hole 114. An accumulation capacitor is composed of a capacitor electrode 103 formed on a glass substrate 101 and the capacitor electrode 112 formed via the gate insulating film 104.

SUMMARY OF THE INVENTION

Therefore, an object of the present invention is to provide a liquid crystal display device with an accumulation capacitor element in which a short-circuited defect can be prevented.

Another object of the present invention is to provide a liquid crystal display device which can insure a necessary capacitance value while keeping an aperture rate of a pixel.

Still another object of the present invention is to provide a method of manufacturing the above liquid crystal display device.

In order to achieve an aspect of the present invention, a liquid crystal display device, includes first and second electrodes and an insulating film. The first electrode is formed on a substrate as one of two electrodes of an accumulation capacitor and applied with a voltage. The insulating film is formed on the first electrode to cover the first electrode. The second electrode is formed on the first electrode via the insulating film as the other electrode of the accumulation capacitor and including a first conductive film and a second conductive film formed on the first conductive film.

Here, it is desirable that the first and second conductive films are formed of material which is not etched when the insulating film is etched. In this case, the first conductive film may include a single layer film formed of a semiconductor material, material selected from the group consisting of Cr (Chrome), Al (Aluminum), W (Tungsten), Mo (Molybdenum), Cu (Copper), Ta (Tantalum), and TaN (Tantalum Nitride), or an alloy material having any of the materials as a main component, or a metal lamination film thereof. Also, the second conductive films may include a single layer film formed of a material selected from the group consisting of Cr (Chrome), Al (Aluminum), W (Tungsten), Mo (Molybdenum), Cu (Copper), Ta (Tantalum), and TaN (Tantalum Nitride), or an alloy material having any of the materials as a main component, or a metal lamination film thereof.

Also, the liquid crystal display device may further include an amorphous semiconductor film disposed between the insulating film and the second electrode.

Also, the first and second conductive films may have a same plane shape. In this case, the liquid crystal display device may further include an amorphous semiconductor film disposed between the insulating film and the second electrode.

Also, the first and second conductive films may have different plane shapes. In this case, the liquid crystal display device may further include an amorphous semiconductor film disposed between the insulating film and the second electrode.

Also, the liquid crystal display device may further include a thin film transistor driving a pixel capacitor, and a transparent electrode connecting between one of a drain and a source of the thin film transistor and the second electrode. In this case, it is desirable that a contact is formed straightly above the first electrode to connect the transparent electrode and the second electrode.

According to another aspect of the present invention, a method of manufacturing a liquid crystal display device, is attained by forming a first electrode on a substrate as one of two electrodes of an accumulation capacitor, the first electrode applied with a voltage; by forming an insulating film on the first electrode to cover the first electrode; and by forming a second electrode on the first electrode via the insulating film as the other electrode of the accumulation capacitor and including first and second conductive films.

Here, it is desirable that the first and second conductive films are formed of material which is not etched when the insulating film is etched. In this case, the first conductive film may include a single layer film formed of a semiconductor material, material selected from the group consisting of Cr (Chrome), Al (Aluminum), W (Tungsten), Mo (Molybdenum), Cu (Copper), Ta (Tantalum), and TaN (Tantalum Nitride), or an alloy material having any of the materials as a main component, or a metal lamination film thereof. Also, the second conductive films may include a single layer film formed of a material selected from the group consisting of Cr (Chrome), Al (Aluminum), W (Tungsten), Mo (Molybdenum), Cu (Copper), Ta (Tantalum), and TaN (Tantalum Nitride), or an alloy material having any of the materials as a main component, or a metal lamination film thereof.

Also, the step of forming a second electrode may be attained by forming a first layer for the first conductive film on the insulating film; by forming a second layer for the second conductive film on the first conductive film; and by patterning the first and second layers such that the first and second conductive films are formed straightly above the first electrode.

Also, the step of forming a second electrode may be attained by forming a first layer for the first conductive film on the insulating film; by patterning the first layer such that the first conductive film is formed straightly above the first electrode; by forming a second layer for the second conductive film on the first conductive film to cover the first conductive film; and by patterning the second layer such that the second conductive film is formed straightly above the first electrode. In this case, the first and second conductive films may have different plane shapes.

Also, the step of forming a second electrode may be attained by forming a first layer for a semiconductor film on the insulating film; by forming a second layer for the first conductive film on the semiconductor film; by patterning the first and second layers such that the semiconductor film and the first conductive film are formed straightly above the first electrode; by forming a third layer for the second conductive film on the first conductive film to cover the first conductive film; and by patterning the third layer such that the second conductive film is formed straightly above the first electrode. In this case, the first and second conductive films may have different plane shapes.

Also, the method may further includes:

forming a thin film transistor driving a pixel capacitor;

forming a second insulating film on the thin film transistor and the second electrode;

forming a contact hole to one of a drain and a source of the thin film transistor and a contact hole to the second electrode, wherein the contact hole to the second electrode is formed straightly above the first electrode; and forming a transparent electrode to connect the one of the drain and the source of the thin film transistor with the second electrode.

DESCRIPTION OF THE PREFERRED EMBODIMENTS

Hereinafter, the liquid crystal display device of the present invention will be described below with reference to the attached drawings.

First Embodiment

Figure 9:
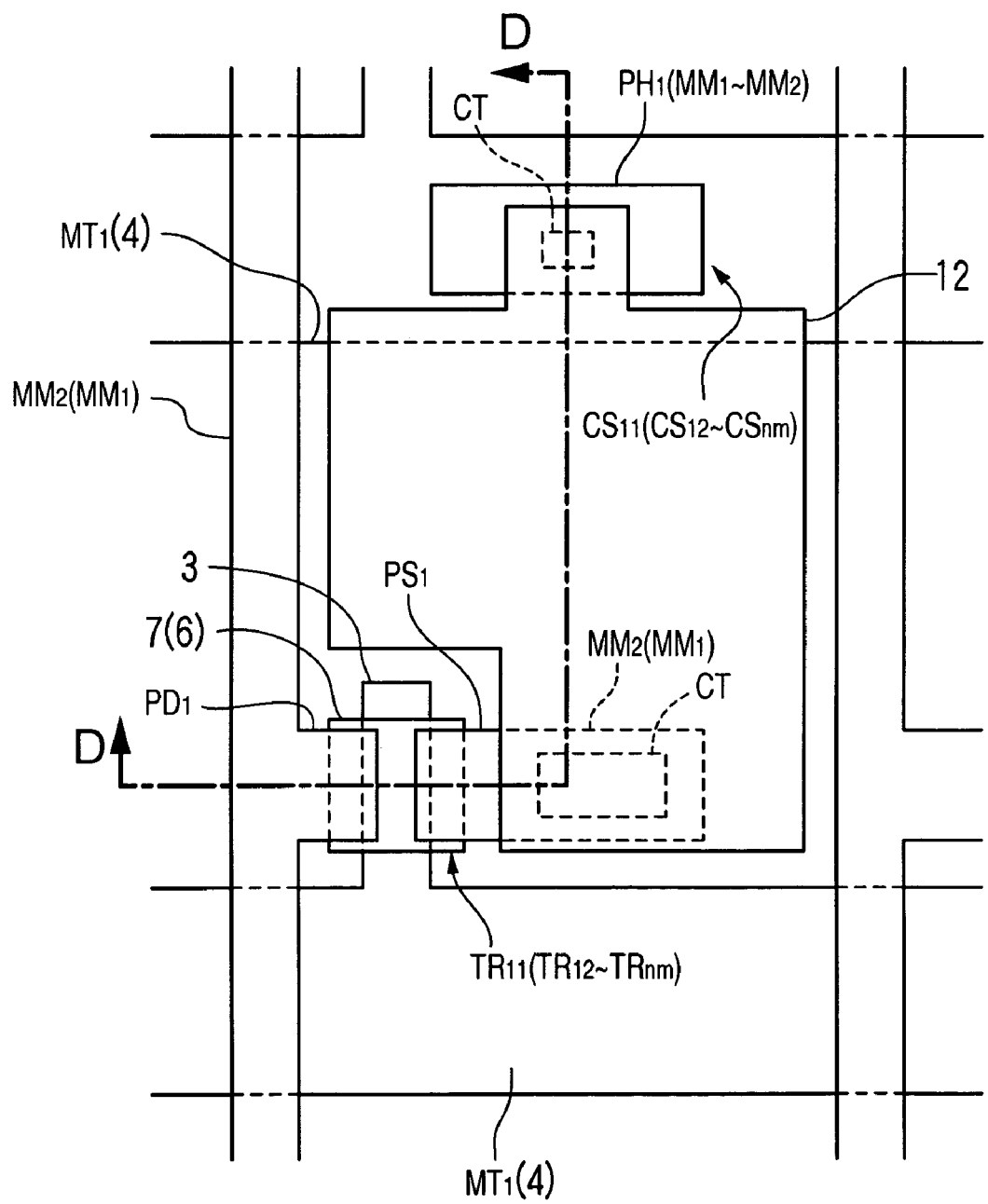
FIG. 9 is a plan view of a liquid crystal display device according to a first embodiment of the present invention.

The structure of the liquid crystal display device according to the first embodiment and the method for manufacturing the same will be described below with reference to FIG. 9 and FIGS. 10A to 10E. FIG. 9 is a partial expanded plan view of an area corresponding to one pixel of the liquid crystal display device in the first embodiment. FIGS. 10A to 10E show cross sectional views of the liquid crystal display device in the first embodiment taken on the line D—D in the method of manufacturing the same.

Figure 10A:
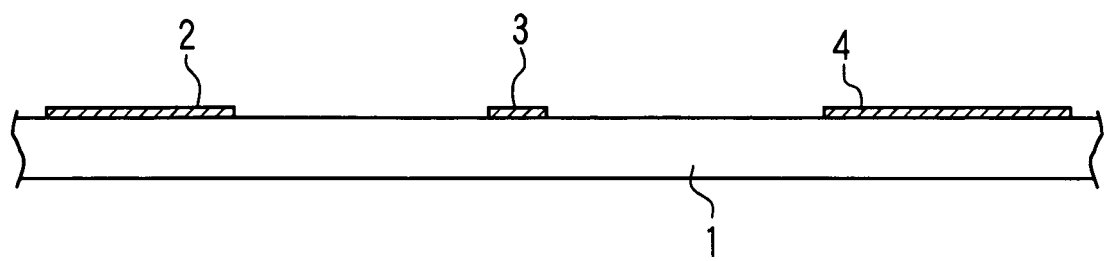
FIGS. 10A to 10E are cross sectional views of the liquid crystal display device according to the first embodiment of the present invention along the line D—D in FIG. 9 in a method of manufacturing it.

Referring to FIG. 10A, a conductive layer MT1 having the thickness of, for example, 1400 Angstroms is deposited on a surface of a transparent glass substrate 1 by use of the technique such as a sputtering method and a CVD (Chemical Vapor Deposition) method. Here, the conductive layer MT1 is composed of a single metal layer film such as Cr (Chrome), Al (Aluminum), W (Tungsten), Mo (Molybdenum), Cu (Copper), Ta (Tantalum), TaN (Tantalum Nitride), or a single film of alloy material having those metals as a main component, or a lamination film of thereof. Subsequently, a resist pattern (not shown) is formed in areas for a terminal region 2, a gate electrode 3, and a gate bus line pattern 4 on the surface of the conductive line layer MT1 by use of the typical photolithography technique. Then, the conductive layer MT1 is etched by use of the resist pattern (not shown) as a mask. Thus, the terminal pattern 2, the gate electrode pattern 3 and the gate bus line pattern 4 are formed. Here, the gate electrode pattern 3 is formed to protrude from the gate bus line pattern 4 and acts as the gate electrode of the thin film transistor.

Figure 10B:
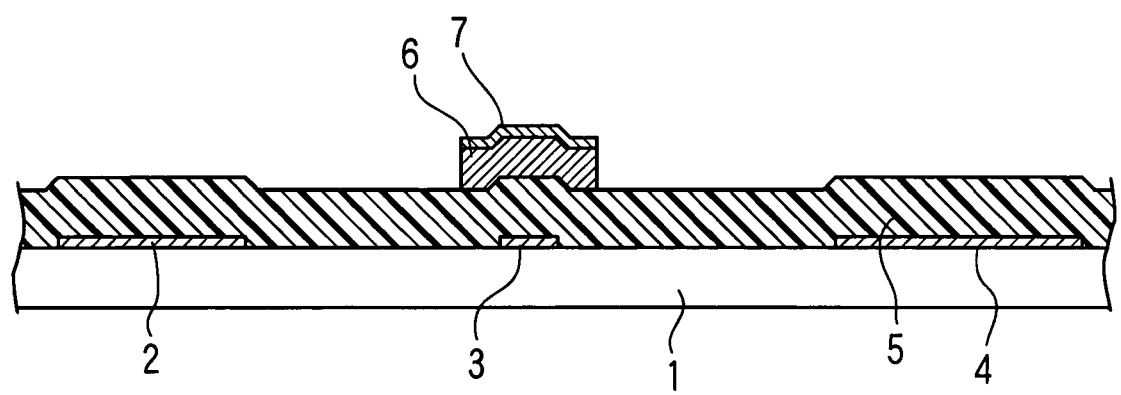

Next, as shown in FIG. 10B, a layer of a gate insulating film 5 is formed, for example, by sequentially laminating a layer of silicon oxide film (SiOx) having the thickness of 1500 Angstroms and a layer of silicon nitride film (SiNx) having the thickness of 3250 Angstroms. Here, in addition to or in place of the above two layers, the material for those insulating films may be a metal oxide film such as SiNO, aluminum oxide (AlOx), and tantalum oxide (TaOx), or an organic insulating film such as polyimide, and benzocyclobutane (BCB), or a lamination film thereof.

Figure 1:
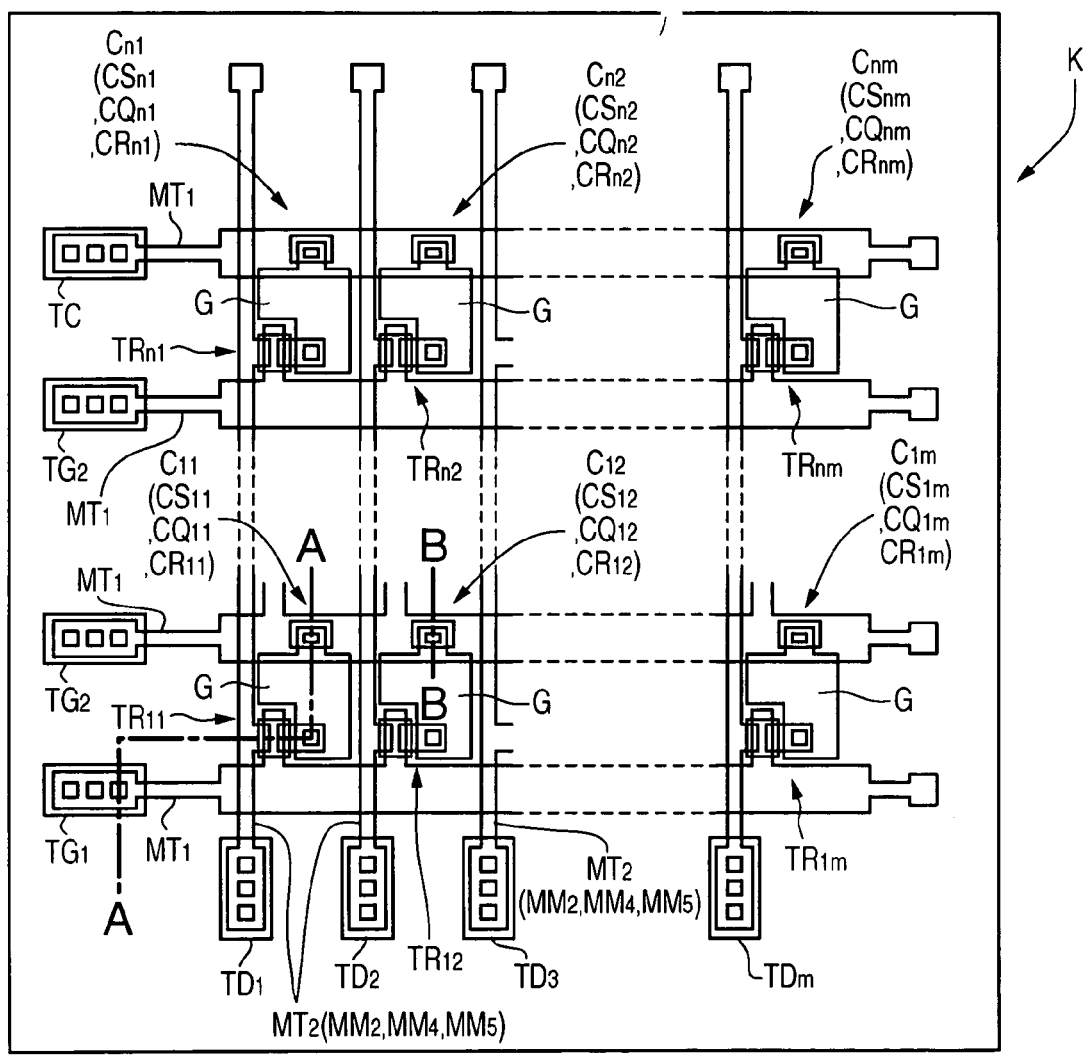
FIG. 1 is a plan view of a first conventional example of a liquid crystal display device.
Figure 2:
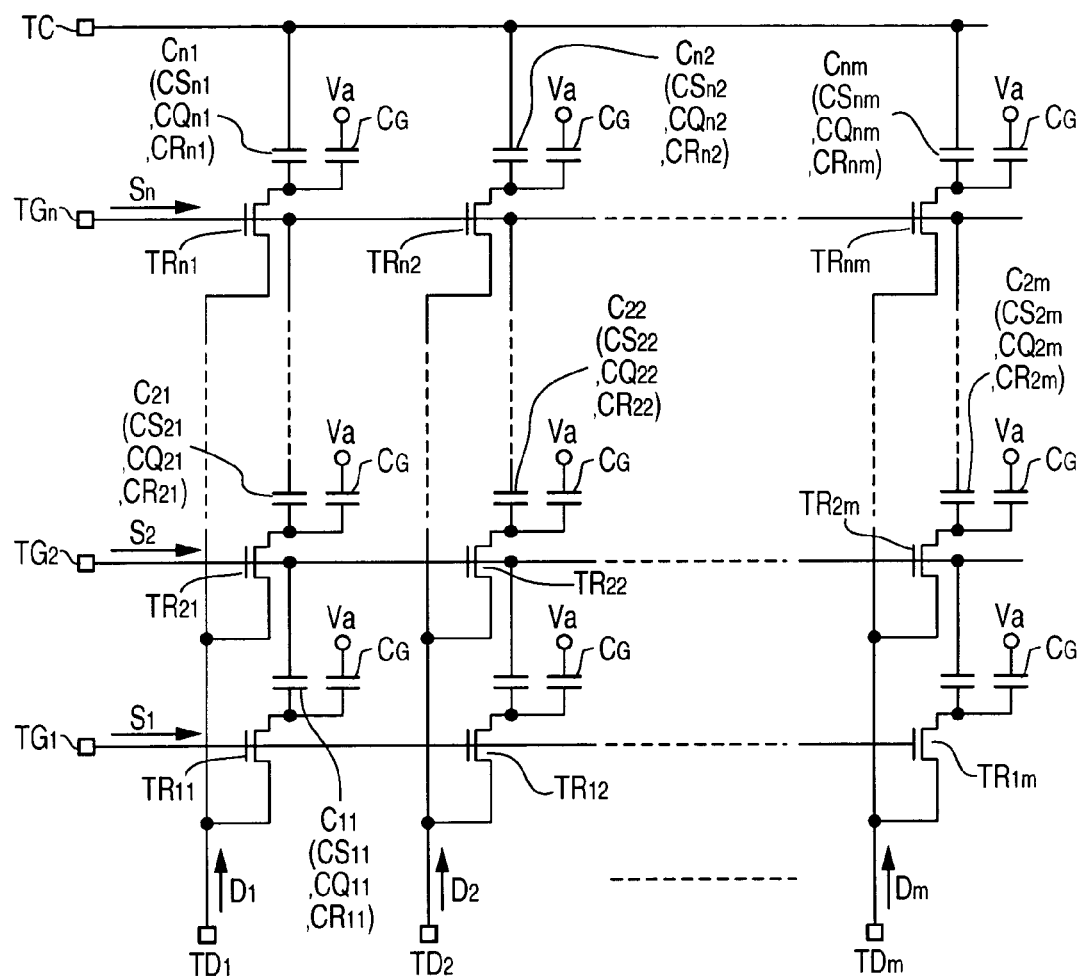
FIG. 2 is an equivalent circuit diagram of the first conventional example of the liquid crystal display device shown in FIG. 1.

Next, an i-type (intrinsic type) a-Si (amorphous silicon) layer and an $n^+$ type a-Si layer for a thin film transistor (corresponding to each of the thin film transistors TR11 to TRnm in FIG. 1) are laminated on the surface of the gate insulating film 5. Then, a resist pattern (not shown) is formed in the area for the thin film transistor on the surface of the $n^+$ type a-Si layer 7 by use of the typical photolithography technique. Then, the a-Si layer 6 and the $n^+$ type a-Si layer 7 are etched by use of the resist pattern (not shown) as a mask. Thus, the patterns of an a-Si film 6 and an $n^+$ type a-Si layer 7 are formed at a time in the position for the pattern of the thin film transistor to be formed.

Figure 10C:
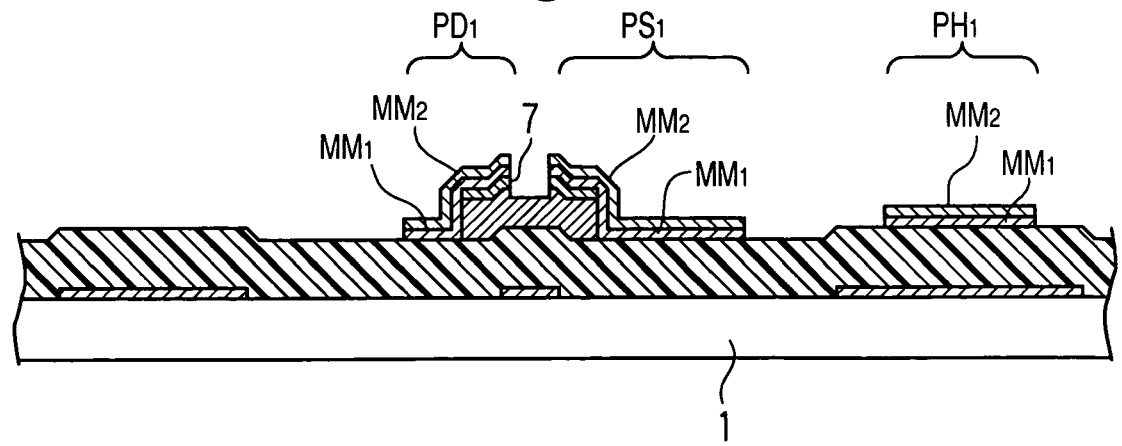

Next, as shown in FIG. 10C, a conductive layer is formed for an auxiliary electrode acting as a counter electrode of an accumulation capacitor element (corresponding to each of the accumulation capacitor elements CS11 to CSnm in FIG. 1) and a drain electrode and a source electrode of the thin film transistor. That is, a metal layer MM1 having the thickness of 700 Angstroms and a metal layer MM2 having the thickness of 700 Angstroms are sequentially deposited on the surface of the $n^+$ type a-Si layer 7 and the surface of the gate insulating film 5 by use of a sputtering method or a CVD method. Here, the metal layers MM1 and MM2 are formed of a single metal layer film such as Cr (Chrome), Al (Aluminum), W (Tungsten), Mo (Molybdenum), Cu (Copper), Ta (Tantalum), and TaN (Tantalum Nitride), or a film of alloy material having those metals as a main component, or a metal lamination film thereof.

Next, a resist pattern (not shown) is formed in the areas for the drain and source electrodes of the thin film transistor on the surface of the metal layer MM2 and the auxiliary electrode of the accumulation capacitor element are formed by use of the typical photolithography technique. Then, the metal layers MM1 and MM2 are etched by use of the resist pattern (not shown) as a mask. Accordingly, a pattern of a drain electrode PD1 and a pattern of a source electrode PS1 are formed in the positions for the drain and the source of the thin film transistor to be formed. A pattern of an auxiliary electrode PH1 is formed in a position for an electrode pattern of the accumulation capacitor element. After that, the $n^+$ type a-Si layer 7 remaining on a channel area of the thin film transistor TR11 (or either of the thin film transistors TR12 to TRnm) is removed.

Figure 10D:
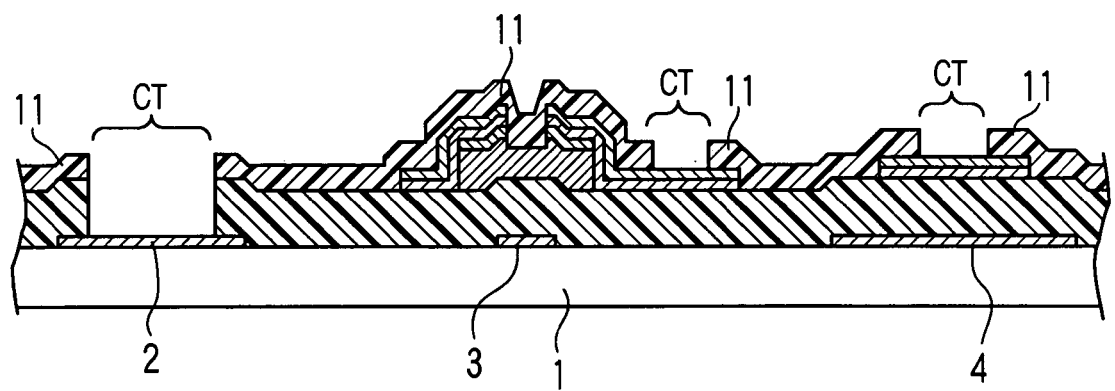

Next, as shown in FIG. 10D, a protective insulating film 11 having the thickness of 2000 Angstroms are deposited on the surfaces of the drain electrode PD1, the source electrode PS1 and the auxiliary electrode PH1 and the surface of the gate insulating film 5 by use of a sputtering method and the CVD method. Here, as the material of the insulating film may be employed a silicon nitride film (SiNx), a silicon oxide film (SiOx), a silicon oxide nitride film (SiNxOy), or a metal oxide film such as aluminum oxide (AlOx), and tantalum oxide (TaOx), or an organic insulating film such as polyimide, and benzocyclobutane (BCB), or those lamination films.

Next, a resist pattern (not shown) is formed in predetermined areas for contact holes to be formed in the protective insulating film 11 by use of the typical photolithography technique. As a result, the resist pattern (not shown) is used as a mask to etch the protective insulating film 11. Thus, contact holes CT are formed at the predetermined areas of the protective insulating film 11. At this time, it is enough to etch and remove only the protective insulating film 11 in order to expose the surface of the auxiliary electrode PH1 of the accumulation capacitor element CS11 (or either one of accumulation capacitor elements CS12 to CSnm in FIG. 1), namely, the surface of the metal layer MM2. However, it is necessary to etch and remove both the protective insulating film 11 and the gate insulating film 5 in order to expose the surface of the terminal pattern 2. The surface of the metal layer MM2 and the surface of the terminal pattern 2 are exposed through the same etching process. Thus, the contact hole CT to the metal layer MM2 is over-etched until the surface of the terminal pattern 2 is exposed when the gate insulating film 5 is etched and removed after the process for etching and removing the protective insulating film 11 is ended so that the surface of the metal layer MM2 is exposed. Thus, the contact hole CT to the metal layer MM2 is dimensionally expanded in a lateral direction as compared with the shape of the pattern of the photo-resist.

Figure 10E:
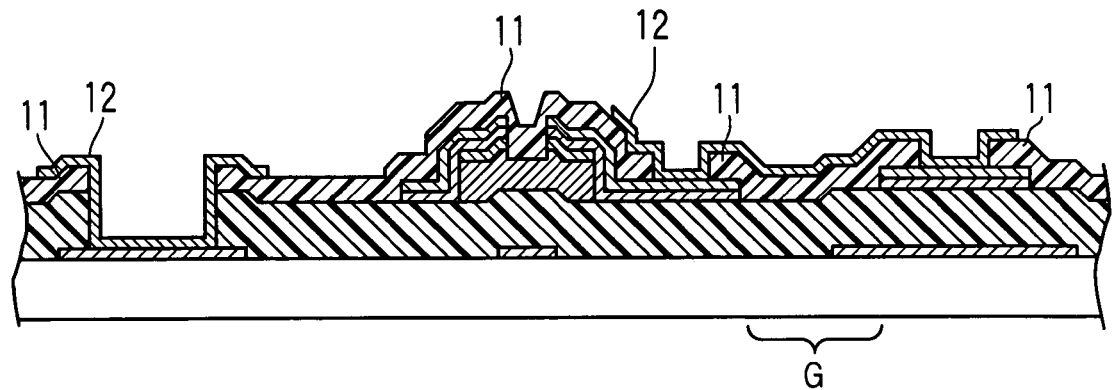

Next, as shown in FIG. 10E, a transparent conductive layer formed of material such as ITO (Indium Tin Oxide) 12 and having the thickness of 400 Angstroms are formed on the surface of the protective insulating film 11, the surface of the terminal pattern 2 exposed through the contact hole CT, the surface of the pattern of the source electrode PS1 exposed through the contact hole CT, and the surface of the auxiliary electrode PH1 exposed through the contact hole CT by use of a sputtering method. A resist pattern (not shown) is formed in predetermined areas for a wiring pattern and a pixel electrode of the conductive layer 12 by use of the typical photolithography technique. Then, the conductive layer 12 is etched by use of the resist pattern (not shown) as a mask. Thus, the wiring pattern for connecting the pixel electrode to the counter electrode of the accumulation capacitor element is formed as the remaining portion of the conductive layer 12 through the etching process.

Figure 3A:
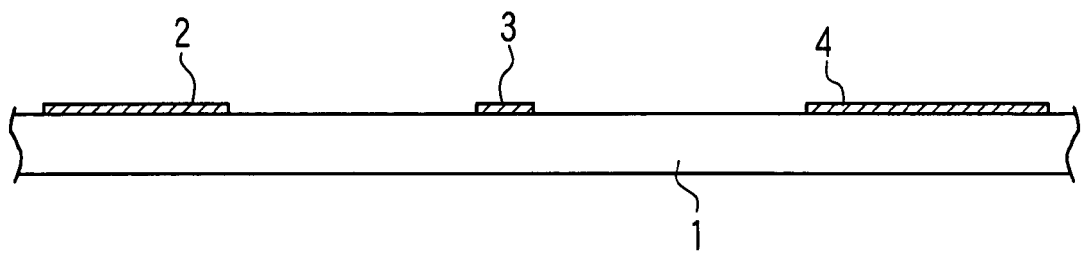
FIGS. 3A to 3E are cross sectional views along the line A—A in FIG. 1 in a method for manufacturing of the first conventional example of the liquid crystal display device.
Figure 3B:
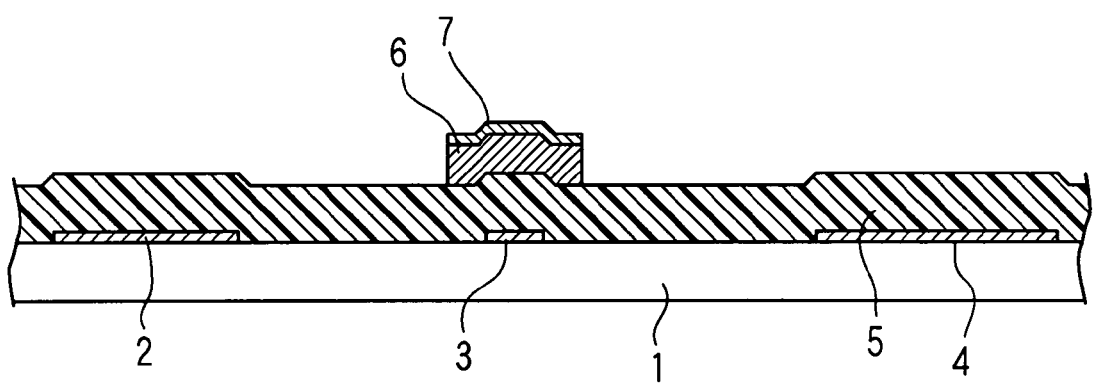
Figure 3C:
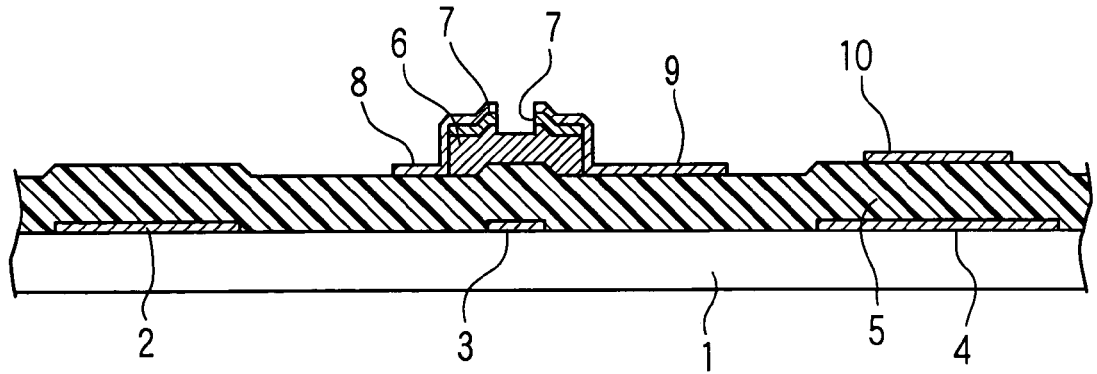
Figure 3D:
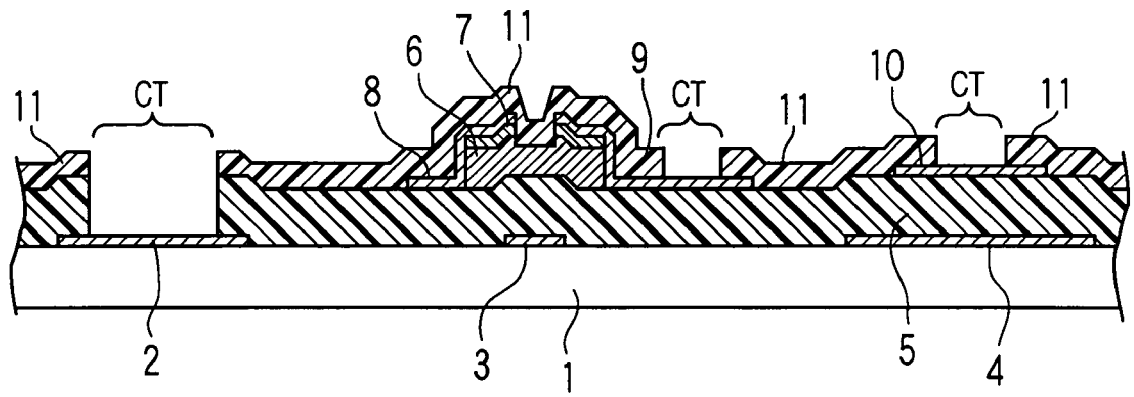
Figure 3E:
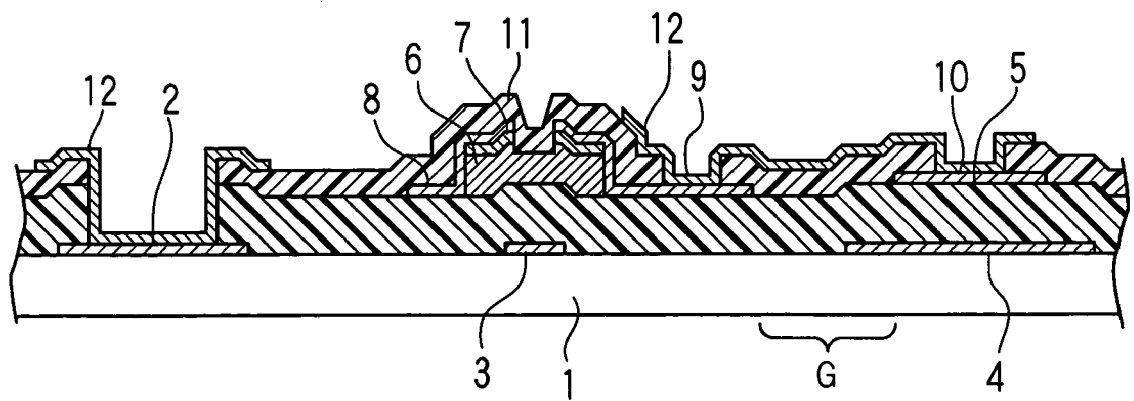
Figure 4:
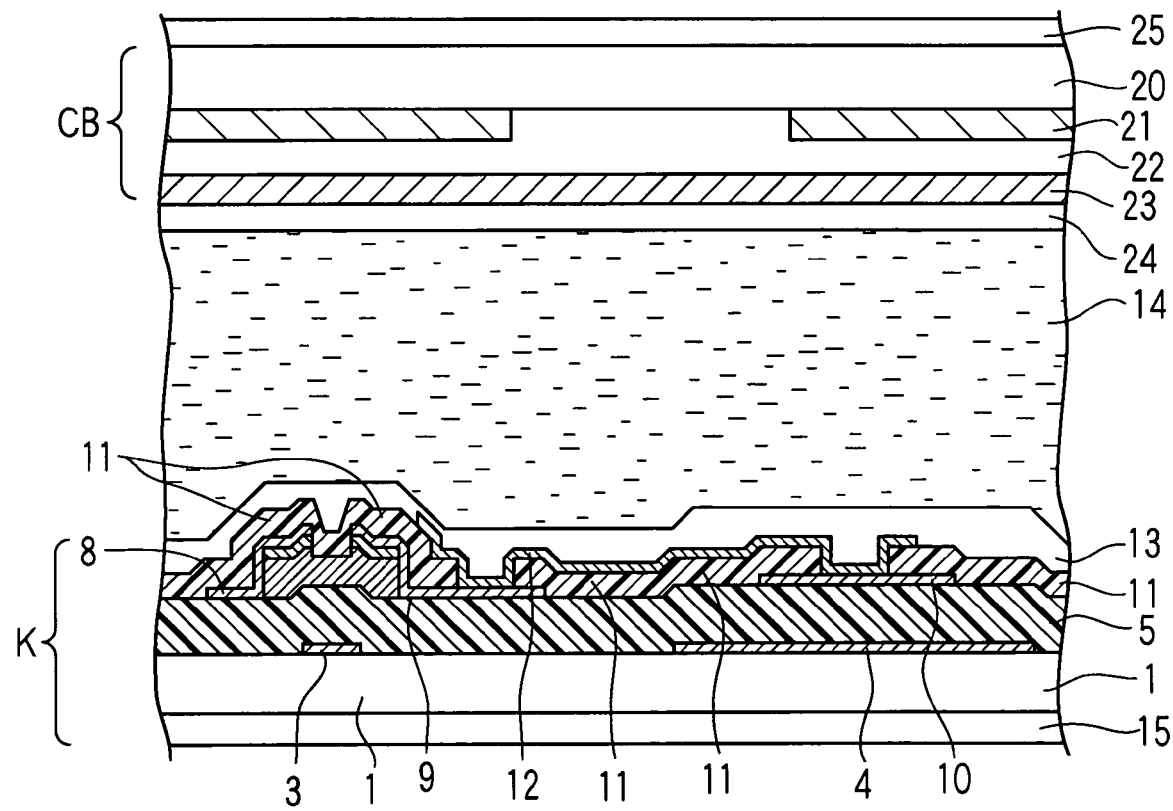
FIG. 4 is a cross sectional view of the first conventional example of the liquid crystal display device along the line A—A in FIG. 1 when it is completed.
Figure 5A:
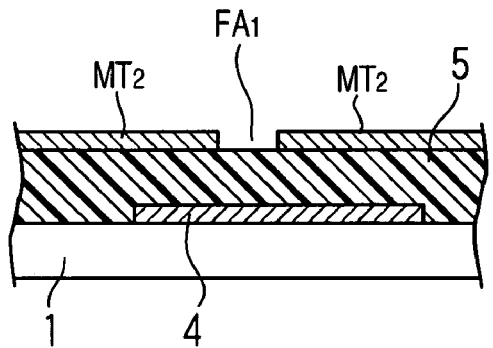
FIGS. 5A to 5F are cross sectional views along the line B—B in FIG. 1 in a method for manufacturing of the first conventional example of the liquid crystal display device.
Figure 5B:
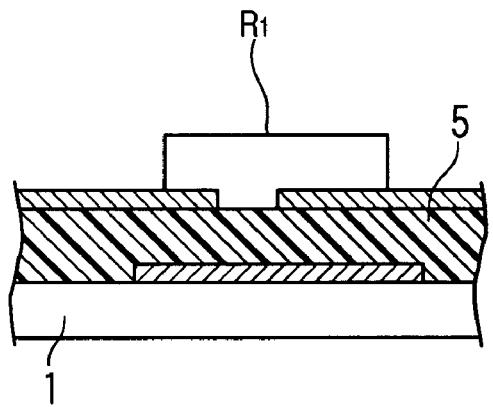
Figure 5C:
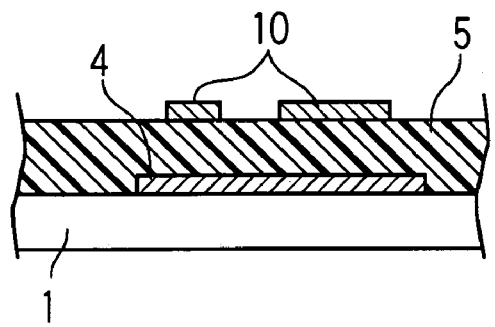
Figure 5D:
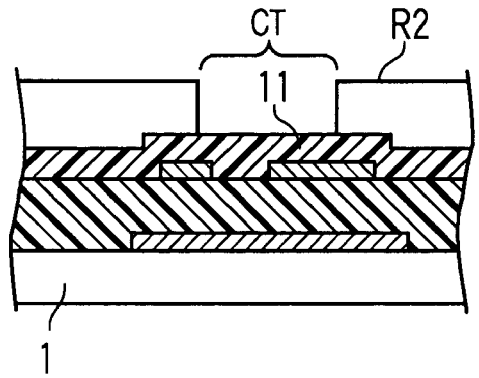
Figure 5E:
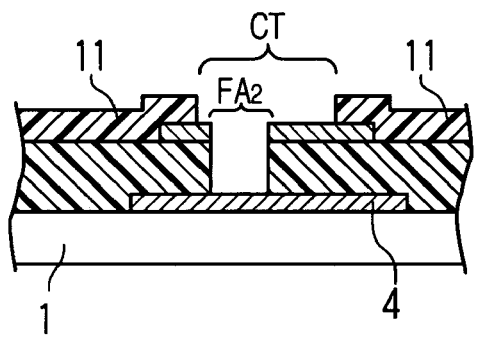
Figure 5F:
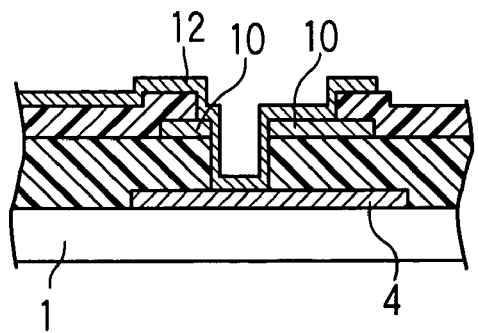
Figure 6A:
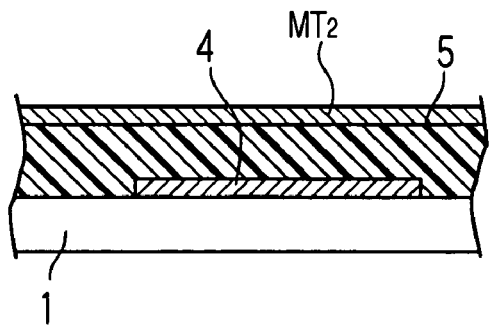
FIGS. 6A to 6C are cross sectional views along the line B—B in FIG. 1 in a method for manufacturing of the first conventional example of the liquid crystal display device.
Figure 6B:
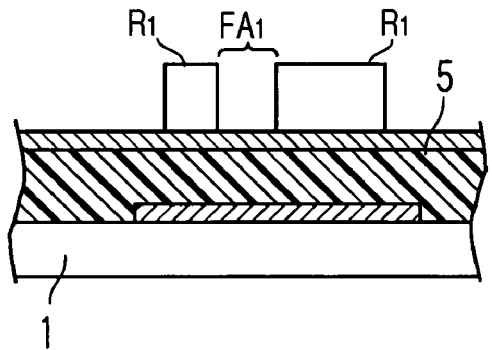
Figure 6C:
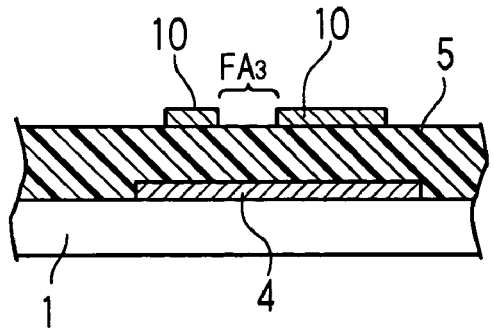
Figure 7:
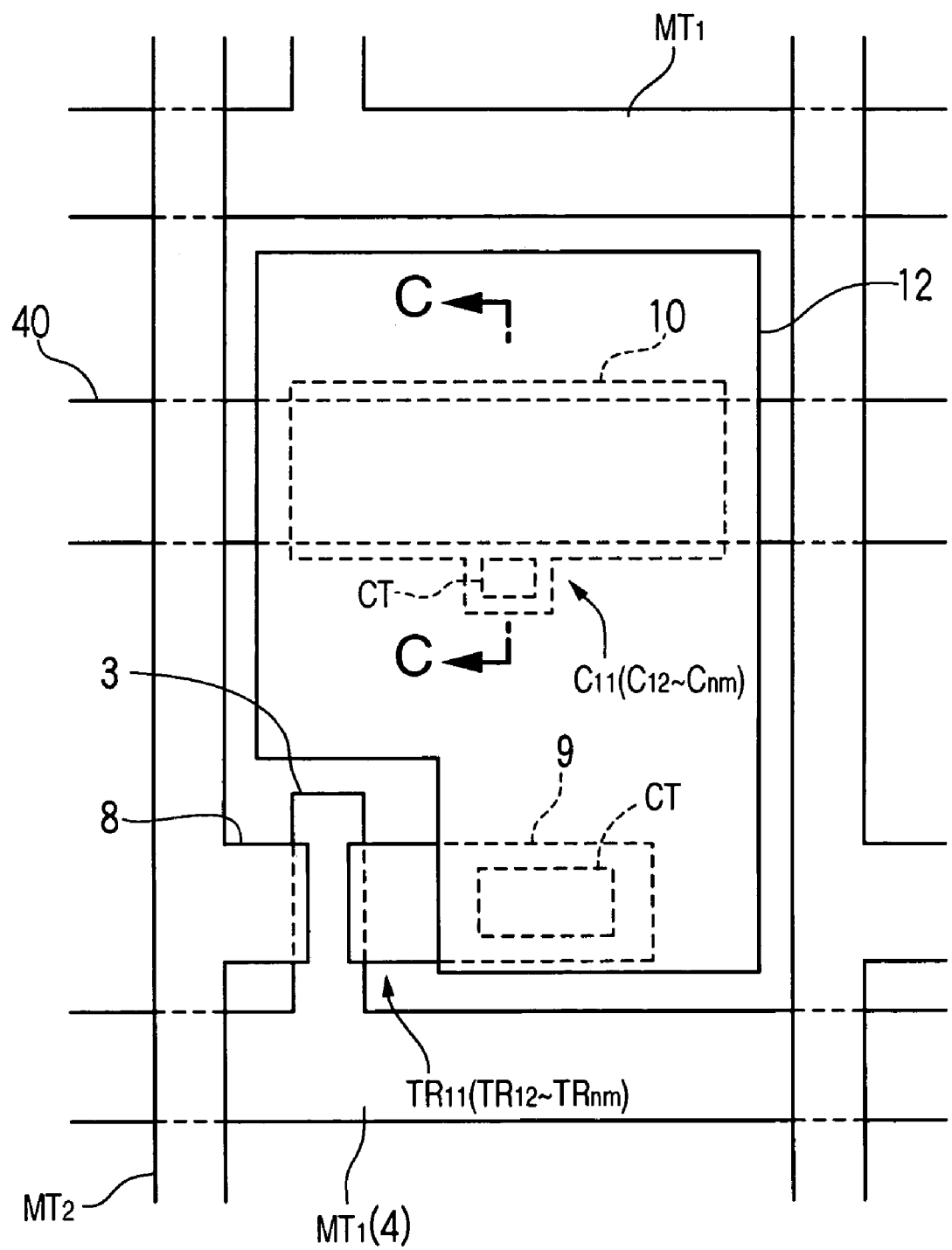
FIG. 7 is a plan view of a second conventional example of a liquid crystal display device.
Figure 8:
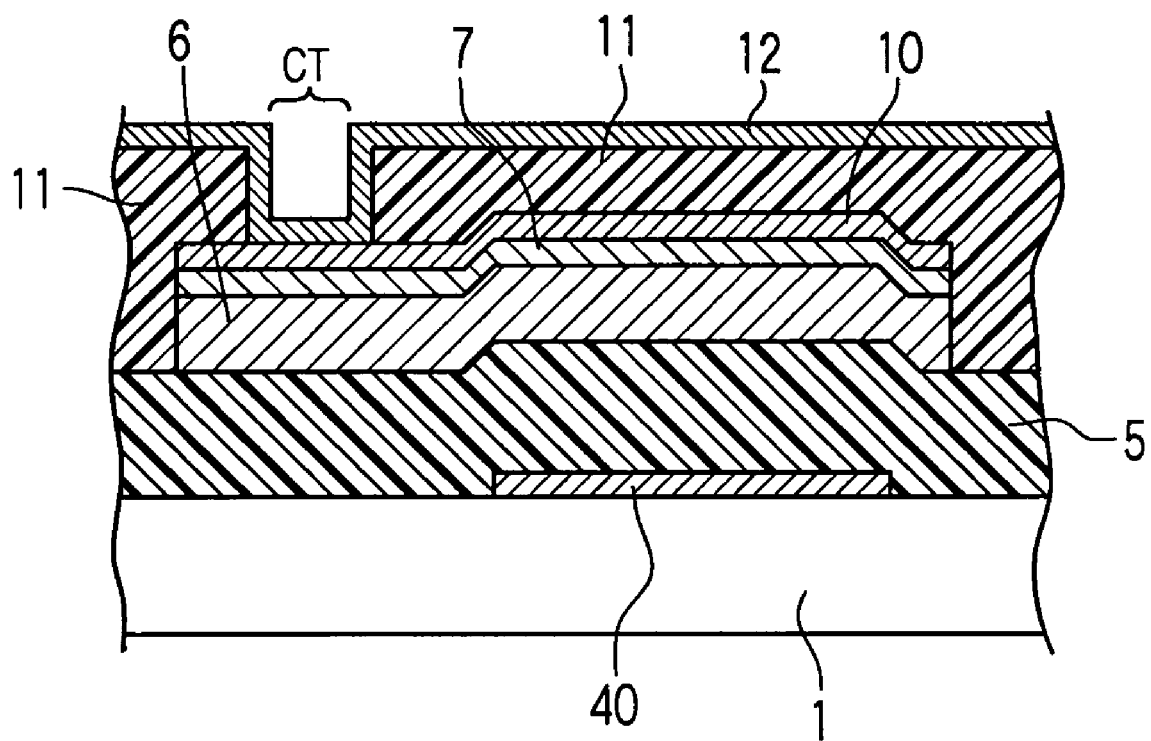
FIG. 8 is a cross sectional view of a second conventional example of a liquid crystal display device along the line C—C in FIG. 7.

The following processes are similar to those described in the conventional example of FIG. 3E. Thus, the description is omitted.

The structure of the accumulation capacitor elements CS11 to CSnm in the liquid crystal display device according to the first embodiment is different from the conventional example in the fact that the auxiliary electrode PH1 is composed of the two-layer structure of the metal layer MM1 and the metal layer MM2. The thin film transistors TR11 to TRnm also have the same symbols as the conventional example. However, the structures of the drain electrode PD1 and the source electrode PS1 are different from those of the conventional example. Also, they are similar in layer structure to the auxiliary electrode PH1. Moreover, the metal layers MM1 and MM2 may be made of the same kind of materials or may be made of different materials.

Accordingly, the metal layer MM2 is formed on the metal layer MM1. Therefore, the probability is very low that the film formation defects overlap with each other at the same place. The metal layers MM1 and MM2 function as a stopper in etching of the protective insulating film 11 on the gate bus line pattern 4. As a result, in the liquid crystal display device in the first embodiment, there is no case that the contact hole CT proceeds up to the gate bus line pattern 4 because of the film formation defect induced when the auxiliary electrode PH1 is formed. The short-circuited defect between the pixel electrode or the auxiliary electrode PH1 and the gate bus line pattern 4 is never brought about. Hence, a point defect of a screen is not caused.

Moreover, according to the liquid crystal display device in the first embodiment, the auxiliary electrode PH1 is located above the gate bus line pattern 4. Thus, the aperture rate is never reduced by anything other than the gate bus line pattern 4. Hence, it is possible to insure a predetermined aperture rate.

In addition, according to the liquid crystal display device in the first embodiment, the accumulation capacitor elements CS11 to CSnm are formed in the metal/insulating film/metal layer. Thus, there is no MIS capacitance. Hence, a desired capacitance of the accumulation capacitor element can be insured.

In the first embodiment, the metal layers MM1 and MM2 are deposited and formed in the different film forming process to have the lamination structure. Thus, even if any film formation defect is induced when the respective metal layers are formed, the probability is reduced that those film formation defects overlap with each other and further the positions thereof coincide with the position of the contact hole. Hence, the short-circuited defect caused by the film formation defect is not substantially caused. However, if a defect is in a resist pattern used to process those metal layers MM1 and MM2 to the shape of the auxiliary electrode and further the defect coincides with the position of the contact hole, the short-circuited defect is induced similarly to the conventional example. In the liquid crystal display device according to the second embodiment of the present invention, it is intended to solve the short-circuited defect caused by the film formation defect and the defect of the resist pattern.

Second Embodiment

Figure 11:
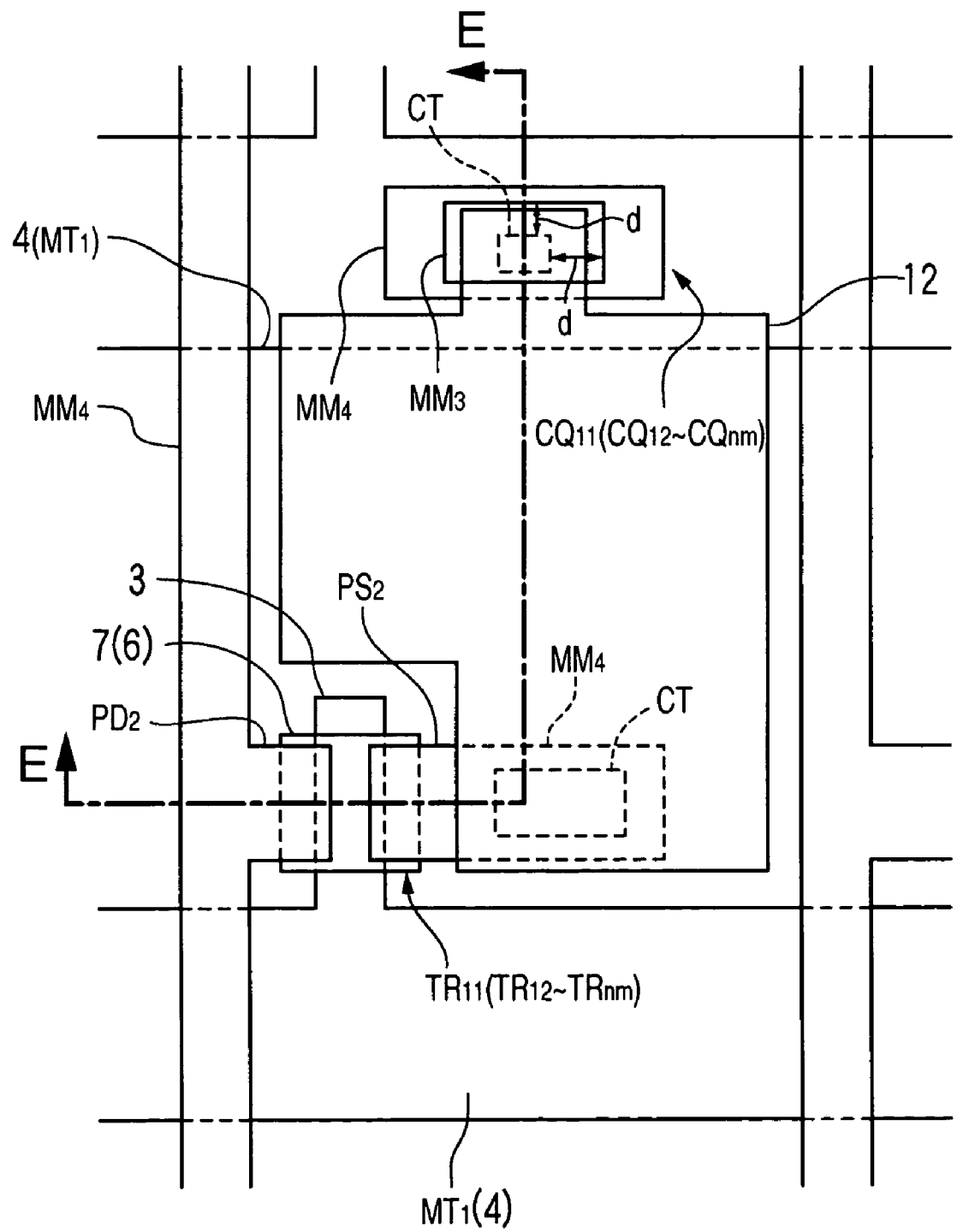
FIG. 11 is a plan view of a liquid crystal display device according to a second embodiment of the present invention.

The liquid crystal display device in the second embodiment will be described below with reference to FIG. 11 and FIGS. 12A to 12F. FIG. 11 is an expanded plan view of the area corresponding to the one pixel in the liquid crystal display device in the second embodiment. The structure of the accumulation capacitor element C11 in FIG. 1 is different from that of an accumulation capacitor element CQ11 (or either of accumulation capacitor elements CQ12 to CQnm) in the second embodiment. The structure together with the manufacturing method will be described below.

FIGS. 12A to 12F show cross sectional views along the line E—E of the liquid crystal display device in the second embodiment manufactured by a method of the present invention.

In FIG. 11, a conductive layer MT1 having the thickness of, for example, 1400 Angstroms is deposited on a surface of a transparent glass substrate 1 by use of the technique such as a sputtering method and a CVD (Chemical Vapor Deposition) method. Here, the conductive layer MT1 is composed of a single metal layer film such as Cr (Chrome), Al (Aluminum), W (Tungsten), Mo (Molybdenum), Cu (Copper), Ta (Tantalum), and TaN (Tantalum Nitride), or an alloy material film having any of those metals as a main component, or a lamination film. Subsequently, a resist pattern (not shown) is formed in an area for a gate electrode on the surface of the conductive line layer MT1 by use of the typical photolithography technique. Then, the conductive layer MT1 is etched by use of the resist pattern (not shown) as a mask. Thus, a terminal pattern 2, a gate electrode pattern 3 and a gate bus line pattern 4 are formed.

Figure 12A:
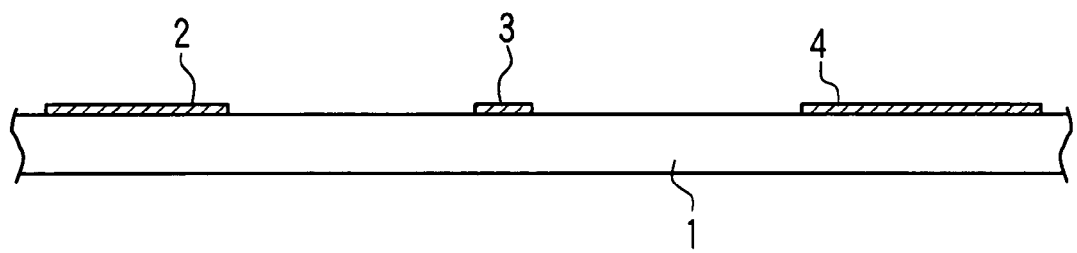
FIGS. 12A to 12F are cross sectional views of the liquid crystal display device according to the second embodiment of the present invention along the line E—E in FIG. 11 in a method of manufacturing it.
Figure 12B:
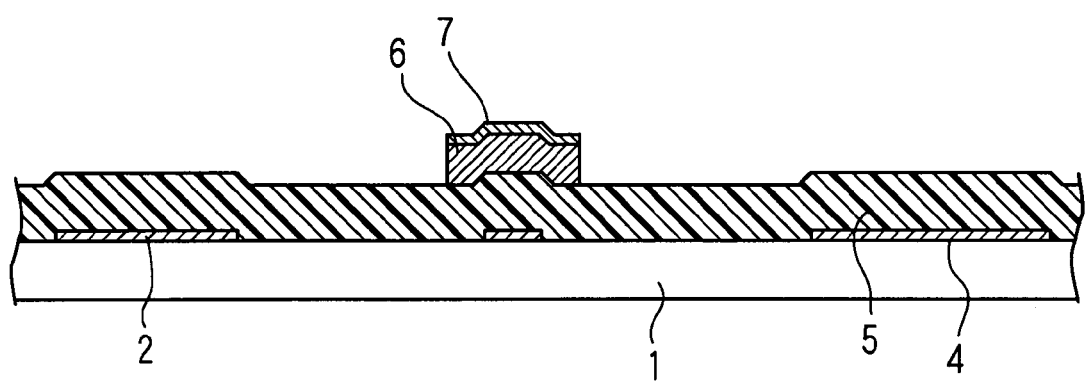

Next, in FIG. 12B, a gate insulating film 5 is formed, for example, by sequentially laminating a layer of silicon oxide film (SiOx) having the thickness of 1500 Angstroms and a layer of silicon nitride film (SiNx) having the thickness of 3250 Angstroms. Here, in addition to or in place to the above two layers, an insulating films may be formed of a metal oxide film of materials such as SiNO, aluminum oxide (AlOx), and tantalum oxide (TaOx), or an organic insulating film such as polyimide and benzocyclobutane (BCB), or those lamination films.

Then, an i-type (intrinsic type) a-Si (amorphous silicon) layer 6 and an $n^+$ type a-Si layer 7 are laminated on the surface of the gate insulating film 5 for a thin film transistor (corresponding to each of the thin film transistors TR11 to TRnm in FIG. 1). Subsequently, a resist pattern (not shown) is formed in the area for the thin film transistor on the surface of the $n^+$ type a-Si layer 7 by use of the typical photolithography technique. Then, the a-Si layer 6 and the $n^+$ type a-Si layer 7 are etched by use of the resist pattern (not shown) as a mask. Thus, the patterns of the a-Si layer 6 and the $n^+$ type a-Si layer 7 are formed in the position for the thin film transistor.

Figure 12C:
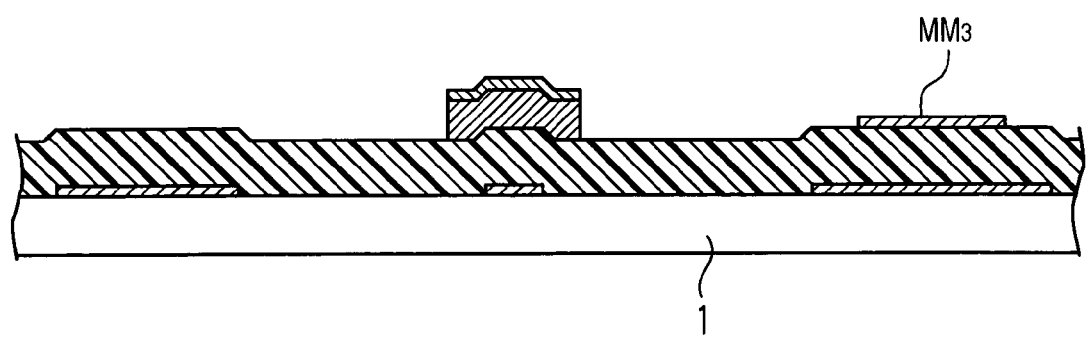

Next, as shown in FIG. 12C, a metal layer MM3 having the thickness of 700 Angstroms, that is, the conductive layer for an auxiliary (counter) electrode of an accumulation capacitor element (corresponding to each of the accumulation capacitor elements CS11 to CSnm in FIG. 1) is deposited on the surface of the gate insulating film 5 straightly above the capacitor electrode 4 by use of a sputtering method or the CVD method. Here, the metal layer MM3 is composed of a single layer film such as Cr (Chrome), Al (Aluminum), W (Tungsten), Mo (Molybdenum), Cu (Copper), Ta (Tantalum), and TaN (Tantalum Nitride), or an alloy material film having any of those metals as a main component, or a lamination films. Subsequently, a resist pattern (not shown) is formed in the area for the auxiliary electrode of the accumulation capacitor element on the surface of the metal layer MM3 by use of the typical photolithography technique. Then, the metal layer MM3 is etched by use of the resist pattern (not shown) as a mask. Thus, a pattern of the metal layer MM3 serving as a lower layer of an auxiliary electrode PH2 is formed at the position where a contact hole CT for the accumulation capacitor element CQ11 (or either of accumulation capacitor elements CQ12 to CQnm) should be formed. The contact hole CT for the accumulation capacitor element CQ11 is formed in the region of the gate bus line pattern 4.

Figure 12D:
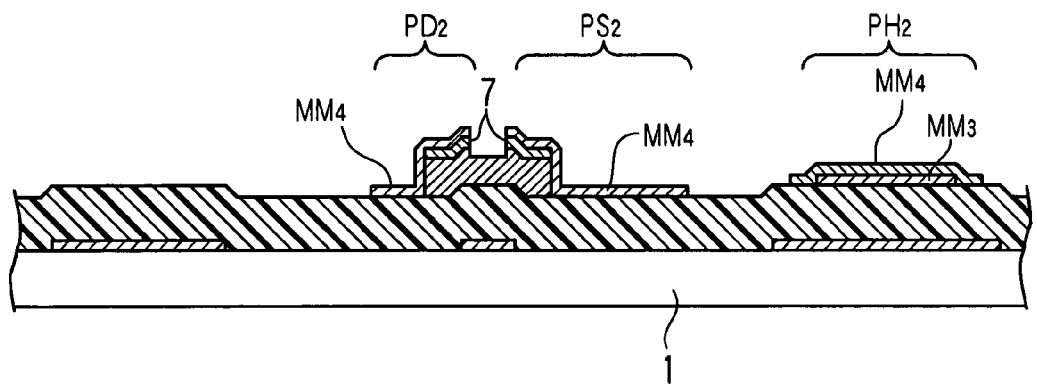

Next, as shown in FIG. 12D, a metal layer MM4 having the thickness of 1400 Angstroms is formed for the upper layer of the auxiliary electrode of the accumulation capacitor element (corresponding to each of the accumulation capacitor elements CS11 to CSnm in FIG. 1), and a drain electrode and source electrode of the thin film transistors on the surface of the $n^+$ type a-Si layer 7, the surface of the gate insulating film 5, and the surface of the pattern of the metal layer MM3 by use of a sputtering method or a CVD method. Here, the metal layer MM4 is formed of a single metal layer film such as Cr (Chrome), Al (Aluminum), W (Tungsten), Mo (Molybdenum), Cu (Copper), Ta (Tantalum), and TaN (Tantalum Nitride), or an alloy material having any of those metals as a main component, or a metal lamination film. Subsequently, a resist pattern (not shown) is formed in the areas for the drain and source electrodes of the thin film transistor on the surface of the metal layer MM4 and the auxiliary electrode of the accumulation capacitor element by use of the typical photolithography technique. Then, the metal layer MM4 is etched by use of the resist pattern (not shown) as a mask. Thus, respective patterns of the drain electrode PD2 and the source electrode PS2 are formed in the positions of the drain and the source of the thin film transistor. The pattern of the auxiliary electrode PH2 is also formed in a position of the accumulation capacitor element. After that, the $n^+$ type a-Si layer 7 remaining on a channel area of the thin film transistor TR11 (or either one of the thin film transistors TR12 to TRnm) is removed.

Figure 12E:
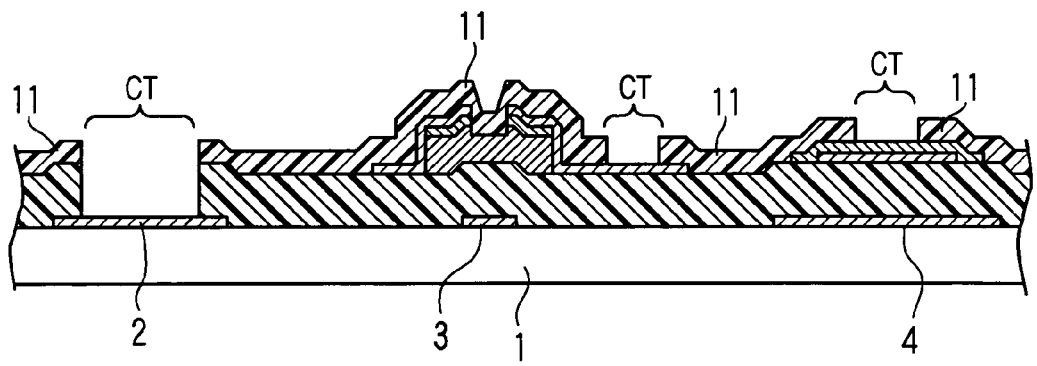

Next, as shown in FIG. 12E, a layer for a protective insulating film 11 having the thickness of 2000 Angstroms is deposited on the surfaces of the drain electrode PD2, the source electrode PS2 and the auxiliary electrode PH2 and the surface of the gate insulating film 5 by use of a sputtering method or a CVD method. Here, the insulating film may be formed of a silicon nitride film (SiNx), silicon oxide film (SiOx), or silicon oxide nitride film (SiNxOy), or a metal oxide film of material such as aluminum oxide (AlOx) and tantalum oxide (TaOx), or an organic insulating film such as polyimide and benzocyclobutane (BCB), or a lamination film of those films.

Next, a resist pattern (not shown) is formed in a predetermined area for contact holes to be formed in the protective insulating film 11, by use of the typical photolithography technique. Then, the resist pattern (not shown) is used as a mask to etch the protective insulating film 11. Thus, the contact holes CT are formed at the predetermined positions of the protective insulating film 11. At this time, it is enough to etch and remove only the protective insulating film 11 in order to expose the surface of the auxiliary electrode PH2 of the accumulation capacitor element CQ11 (or either one of accumulation capacitor elements CQ12 to CQnm), namely, the surface of the metal layer MM4. However, it is necessary to etch and remove both of the protective insulating film 11 and the gate insulating film 5 in order to expose the surface of the terminal pattern 2.

The surface of the metal layer MM4 and the surface of the terminal pattern 2 are exposed by the same etching process. Thus, the contact hole CT to the metal layer MM4 is over etched until the exposure of the surface of the terminal pattern 2 when the gate insulating film 5 is etched and removed after the exposure of the surface of the metal layer MM4 when the operation for etching and removing the protective insulating film 11 is ended. Thus, the contact hole CT to the metal layer MM4 is dimensionally expanded in a lateral direction as compared with the shape of the pattern resulting from the photo-resist The positional relation between the opening of the contact hole CT in the thus-formed area of the accumulation capacitor element CQ11 (or either one of accumulation capacitor elements CQ12 to CQnm) and the metal layer MM3 in the auxiliary electrode PH2 is in the condition that the opening (circumference edge) of the contact hole CT invades into the pattern of the metal layer MM3 by a distance [d] as shown in FIG. 11. This distance [d] implies the sum of a marginal dimension and an increased distance in a lateral direction of the contact hole. The marginal dimension includes an error resulting from a positional deviation when the pattern of the metal layer MM3 and the contact hole CT are produced. The increased distance in the lateral direction of the contact hole results from the over etching to etch the contact hole up to the terminal pattern 2. In this example, the size of the metal layer MM3 in the auxiliary electrode PH2 is determined for the size of the contact hole CT. On the contrary, the size of the metal layer MM4 in the auxiliary electrode PH2 is determined for the contact hole CT, and then the metal layer MM3 may be determined for the metal layer MM4. Also, both of the metal layers MM3 and MM4 may be formed sufficiently larger as compared with the distance [d] against the contact hole CT. Moreover, the metal layers MM3 and MM4 in the auxiliary electrode PH2 may be overlapped with each other and formed under the same size, similarly to the first embodiment.

Figure 12F:
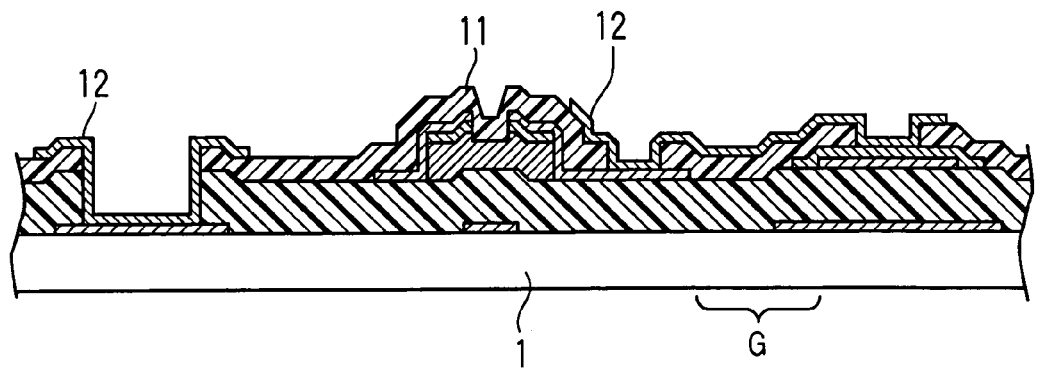

Next, as shown in FIG. 12F, a transparent conductive layer of for example, ITO (Indium Tin Oxide) 12 having the thickness of 400 Angstroms is formed on the surface of the protective insulating film 11, the surface of the terminal pattern 2 exposed through the contact hole CT, the surface of the pattern of the source electrode PS2 exposed through the contact hole CT, and the surface of the auxiliary electrode PH2 exposed through the contact hole CT, by use of the sputtering method. Subsequently, a resist pattern (not shown) is formed in predetermined areas for a wiring pattern and a pixel electrode of the conductive layer 12 by use of the typical photolithography technique. Then, the conductive layer 12 is etched by use of the resist pattern (not shown) as a mask. Thus, the wiring pattern for connecting the pixel electrode and the predetermined electrode to each other is formed as the remaining portion of the conductive layer 12 resulting from the etching.

The following processes are similar to those described in the conventional example of FIG. 3E. Thus, the description is omitted.

The structure of the accumulation capacitor elements CQ11 to CQnm in the liquid crystal display device according to the second embodiment is different from that of the conventional example, in the fact that the auxiliary electrode PH2 is composed of the two-layer structure of the metal layer MM3 and the metal layer MM4 in which the patterns are formed by use of the different photo-resist masks.

The structures of the drain electrodes PD2 and source electrodes PS2 in the thin film transistors TR11 to TRnm may be formed of the single layer of the metal layer MM3 or MM4 or may be formed of the lamination layer of the metal layers MM3 and MM4.

Moreover, the metal layers MM3 and MM4 may be made of the same kind of materials or may be made of different materials.

Accordingly, the overlap formation of the metal layers MM3 and MM4 very reduces the probability that the film formation defects overlap with each other at the same place. The metal layers MM3 and MM4 function as the stopper in etching of the protective insulating film 11 on the gate bus line pattern 4. As a result, in the liquid crystal display device in the second embodiment, there is no case that the contact hole CT proceeds up to the gate bus line pattern 4 because of the film formation defect formed when the auxiliary electrode PH2 is formed. The short-circuited defect between the pixel electrode or the auxiliary electrode PH2 and the gate bus line pattern 4 is never induced. Hence, the point defect is not brought about.

Also, in the liquid crystal display device of the second embodiment, with regard to the metal layers MM3 and MM4, the different photo-resists are used as masks to separately form the pattern of the auxiliary electrode PH2. Thus, the probability that the film defects induced in the metal layers MM3 and MM4 overlap with each other at the same place becomes very low even if the defect of the babble mixture in the photo-resist causes the film defects to be respectively induced in the metal layers MM3 and MM4 when the metal layers MM3 and MM4 of the auxiliary electrode PH2 are etched. As a result, according to the liquid crystal display device of the second embodiment, there is no case that the contact hole CT proceeds up to the gate bus line pattern 4 because of the film defect induced at the time of etching in the formation of the auxiliary electrode PH2. The short-circuited defect is never induced in the conductive layer 12 between the pixel electrode or the auxiliary electrode PH2 and the gate bus line pattern 4. Hence, the point defect is not brought about.

Moreover, according to the liquid crystal display device of the second embodiment, the auxiliary electrode PH2 is located straightly above the gate bus line pattern 4. Thus, the aperture rate is never reduced by anything other than the gate bus line pattern 4. Hence, the predetermined aperture rate can be insured.

In addition, according to the liquid crystal display device of the second embodiment, the accumulation capacitor elements CQ11 to CQnm are formed in the metal/insulating film/metal layer. Thus, there is no MIS capacitance. Hence, the liquid crystal display device of the second embodiment has the effect of insuring the capacitance of the predetermined charge accumulation.

In the second embodiment, the patterning processes for the metal layers MM3 and MM4 are separately carried out. Thus, even if the film formation defect and the defect of the photo-resist exist in the respective metal layers, the probability can be reduced that those defects overlap with each other and further the positions thereof coincide with the position of the contact hole. Hence, the short-circuited defect is not substantially induced by the film formation defect or the defect of the resist pattern. However, the number of processes is increased since one mask must be increased over the conventional technique in order to process the metal layers MM3 and MM4. Therefore, a third embodiment is intended to solve the short-circuited defect caused by both of the film formation defect and the defect of the resist pattern without increasing the number of processes.

Third Embodiment

Figure 13:
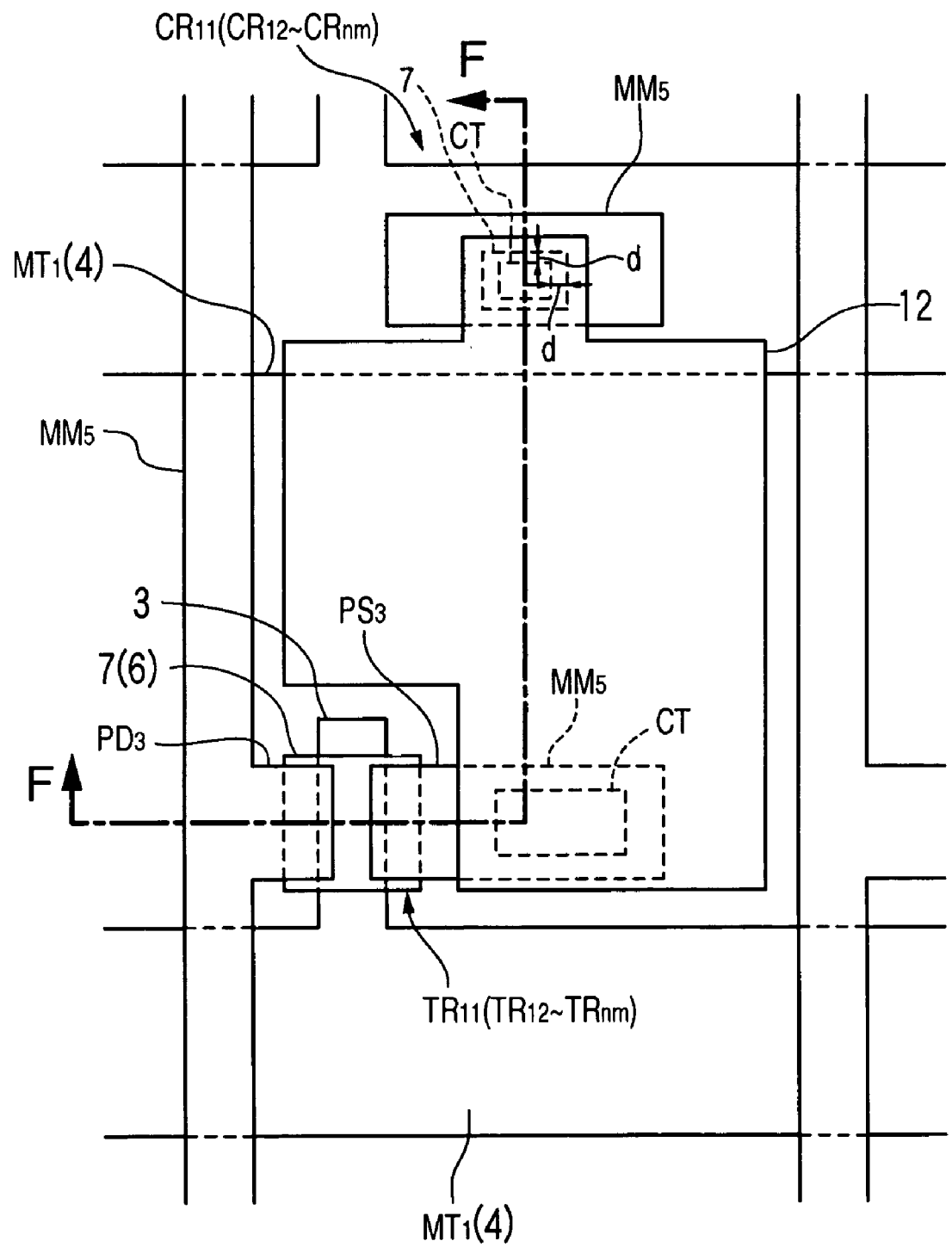
FIG. 13 is a plan view of the liquid crystal display device according to a third embodiment of the present invention.

The structure of the liquid crystal display device according to the third embodiment will be described below with reference to FIG. 13 and FIGS. 14A to 14E. FIG. 13 is an expanded plan view of the area corresponding to the one pixel in the liquid crystal display device according to the third embodiment. The structure of the accumulation capacitor element C11 in FIG. 1 is different from that of an accumulation capacitor element CR11 (or either one of accumulation capacitor elements CR12 to CRnm) in the third embodiment. Therefore, the structure together with the manufacturing method will be described below.

FIGS. 14A to 14E show cross sectional views along the line F—F of the liquid crystal display device according to the third embodiment manufactured by a method of the present invention.

Figure 14A:
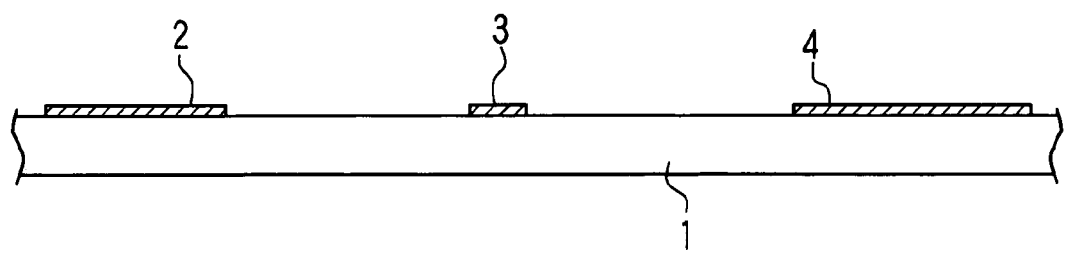
FIGS. 14A to 14E are cross sectional views of the liquid crystal display device according to the third embodiment of the present invention along the line F—F in FIG. 13 in a method of manufacturing it.

As shown in FIG. 14A, a conductive layer MT1 having the thickness of, for example, 1400 Angstroms is deposited on a surface of a transparent glass substrate 1 by use of the technique such as a sputtering method or a CVD (Chemical Vapor Deposition) method. Here, the conductive layer MT1 is composed of a single metal layer film of materials such as Cr (Chrome), Al (Aluminum), W (Tungsten), Mo (Molybdenum), Cu (Copper), Ta (Tantalum), and TaN (Tantalum Nitride), or an alloy material having any of those metals as a main component, or a lamination film. Subsequently, a resist pattern (not shown) is formed in an area for a gate electrode on the surface of the conductive line layer MT1 by use of the typical photolithography technique. Then, the conductive layer MT1 is etched by use of the resist pattern (not shown) as a mask. Thus, a terminal pattern 2, a gate electrode pattern 3 and a gate bus line pattern 4 are formed.

Figure 14B:
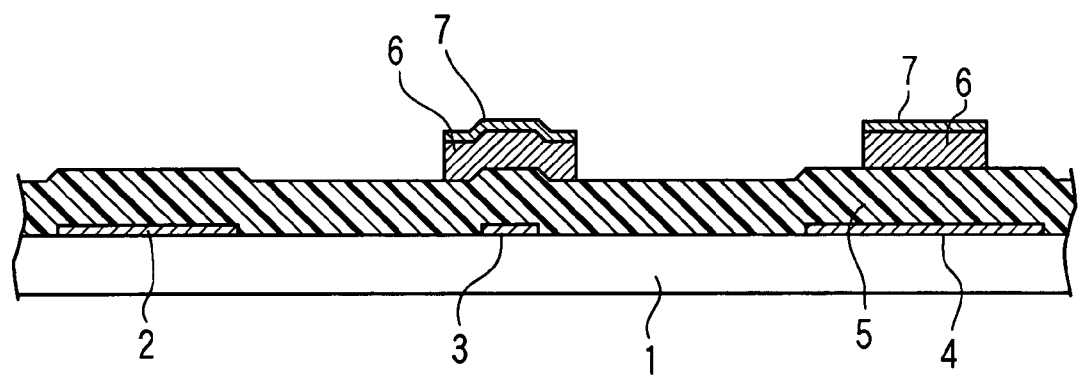

Next, as shown in FIG. 14B, a gate insulating film 5 is formed, for example, by sequentially laminating a layer of silicon oxide film (SiOx) having the thickness of 1500 Angstroms and a layer of silicon nitride film (SiNx) having the thickness of 3250 Angstroms. Here, in addition to or in place of the above two layers, the insulating film may further formed of a metal oxide film of materials such as SiNO, aluminum oxide (AlOx), tantalum oxide (TaOx), or an organic insulating film of materials such as polyimide and benzocyclobutane (BCB), or a lamination film.

Then, an i-type (intrinsic type) a-Si (amorphous silicon) layer 6 and an n$^+$ type a-Si layer 7 serving as the thin film transistor (corresponding to each of the thin film transistors TR11 to TRnm in FIG. 1) are laminated on the surface of the gate insulating film 5, in turn. Next, a resist pattern (not shown) is formed in the area for the thin film transistor on the surface of the n$^+$ type a-Si layer 7 and an accumulation capacitor element (corresponding to the accumulation capacitor elements CR11 to CRnm in FIG. 1) are formed by use of the typical photolithography technique. Then, the a-Si layer 6 and the n$^+$ type a-Si layer 7 are etched by use of the resist pattern (not shown) as a mask. Thus, the patterns of the a-Si layer 6 and the n$^+$ type a-Si layer 7 are formed in the positions for a contact hole CT of the accumulation capacitor element CS and the thin film transistor.

Figure 14C:
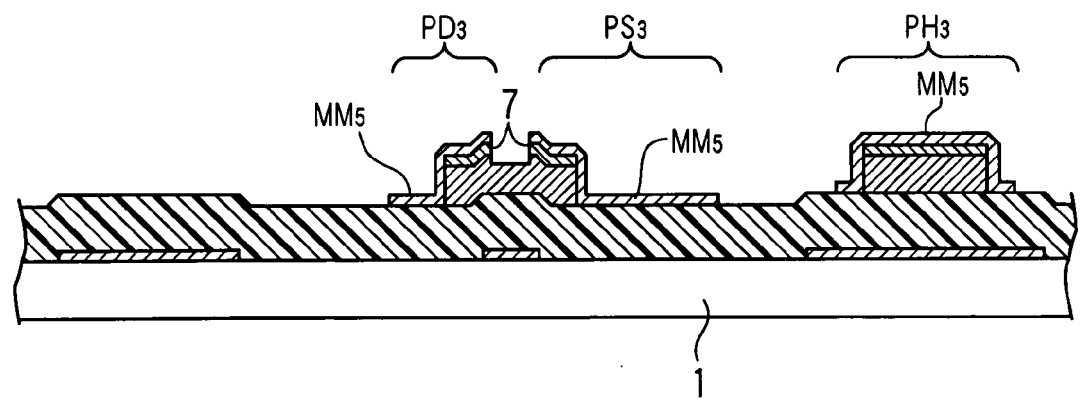

Next, as shown in FIG. 14C, a metal layer MM5 having the thickness of 1400 Angstroms is deposited for an auxiliary electrode acting as a counter electrode of an accumulation capacitor element (corresponding to each of the accumulation capacitor elements CS11 to CSnm in FIG. 1) and a drain electrode and source electrode of the thin film transistors on the surface of the n$^+$ type a-Si layer 7 and the surface of the gate insulating film 5 by use of a sputtering method and a CVD method. Here, the metal layer MM3 is formed of a single metal layer film of materials such as Cr (Chrome), Al (Aluminum), W (Tungsten), Mo (Molybdenum), Cu (Copper), Ta (Tantalum), and TaN (Tantalum Nitride), or an alloy material film having any of the metals as a main component, or a metal lamination film.

Then, a resist pattern (not shown) is formed in the area for the auxiliary electrode of the accumulation capacitor element is formed on the surface of the metal layer MM5 by use of the typical photolithography technique. Then, the metal layer MM5 is etched by use of the resist pattern (not shown) as a mask. Thus, respective patterns of a drain electrode PD3 and a source electrode PS3 are formed in the positions of the drain and source of the thin film transistor. Also, a pattern of the metal layer MM5 serving as an upper layer of an auxiliary electrode PH3 of the accumulation capacitor element is formed. After that, the n$^+$ type a-Si layer 7 remaining on the channel area of the thin film transistor TR11 (or either one of the thin film transistors TR12 to Trnm) is removed.

Figure 14D:
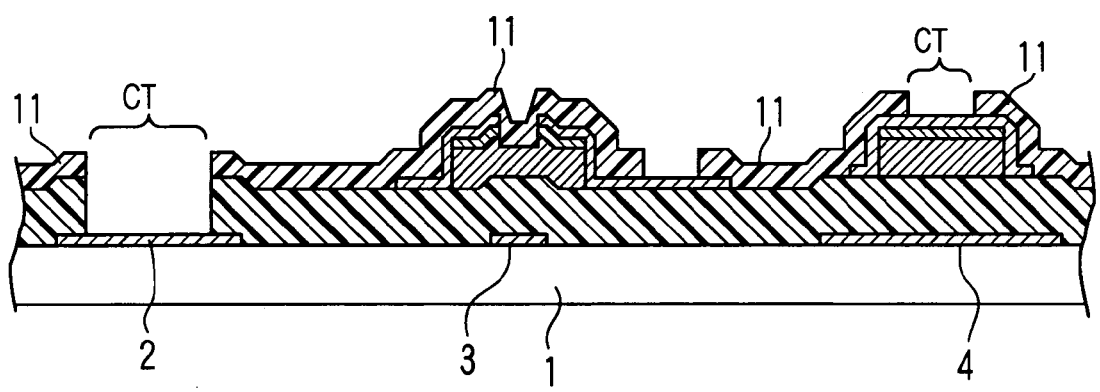

Next, in FIG. 14D, a protective insulating film 11 having the thickness of 2000 Angstroms is deposited on the surfaces of the drain electrode PD3, the source electrode PS3 and the auxiliary electrode PH3 and the surface of the gate insulating film 5 by use of a sputtering method or a CVD method. Here, in addition to or in place of the above insulating film 11, an insulating film may be formed of a silicon nitride film (SiNx), a silicon oxide film (SiOx), a silicon oxide nitride film (SiNxOy), or a metal oxide film of materials such as a aluminum oxide (AlOx) and tantalum oxide (TaOx), or an organic insulating film of materials such as polyimide and benzocyclobutane (BCB), or a lamination film.

Next, a resist pattern (not shown) is formed in a predetermined area for contact holes to be formed in the protective insulating film 11 by use of the typical photolithography technique. Then, the resist pattern (not shown) is used as a mask to etch the protective insulating film 11. Thus, the contact holes CT are formed at the predetermined positions of the protective insulating film 11. At the time, it is enough to etch and remove only the protective insulating film 11 in order to expose the surface of the auxiliary electrode PH3 of the accumulation capacitor element CR11 (or accumulation capacitor elements CR12 to CRnm), namely, the surface of the metal layer MM5. However, it is necessary to etch and remove both of the protective insulating film 11 and the gate insulating film 5 in order to expose the surface of the terminal pattern 2. The surface of the metal layer MM5 and the surface of the terminal pattern 2 are exposed by the same etching process. Thus, the contact hole CT to the metal layer MM5 is over-etched until the exposure of the surface of the terminal pattern 2 when the gate insulating film 5 is etched and removed after the exposure of the surface of the metal layer MM5 when the operation for etching and removing the protective insulating film 11 is ended. Thus, the contact hole CT to the metal layer MM5 is dimensionally expanded in a lateral direction as compared with the shape of the pattern resulting from the photo-resist.

The positional relation between the opening of the contact hole CT in the thus-formed area of the accumulation capacitor element CQ11 (or accumulation capacitor elements CQ12 to CQnm) and the pattern of the n$^+$ type a-Si layer 7 in the auxiliary electrode PH3 is in the condition that the opening (circumference edge) of the contact hole CT invades into the patterns of the a-Si layer 6 and the n$^+$ type a-Si layer 7 by a distance [d], as shown in FIG. 13. This distance [d] implies the sum of a marginal dimension against an error and an increased distance in a lateral direction of the contact hole. The marginal dimension against an error results from a positional displacement when the patterns of the a-Si layer 6 and the n$^+$ type a-Si layer 7 and the contact hole CT are produced. Also, the increased distance in a lateral direction of the contact hole results from the over-etching to etch the contact hole up to the terminal pattern 2. Therefore, if the distance [d] is made excessively longer, the patterns of the a-Si layer 6 and the n$^+$ type a-Si layer 7 are made larger to thereby increase the MIS capacitance in the accumulation capacitor element CQ11 (or accumulation capacitor elements CQ12 to CQnm). Thus the capacitance value is reduced in area ratio, and a predetermined capacitance can not be obtained. Hence, the distance [d] needs to be equal to the sum of the marginal dimension in anticipation of the error resulting from the positional deviation at the time of the production and the increased distance in the lateral direction of the contact hole resulting from the over etching.

Figure 14E:
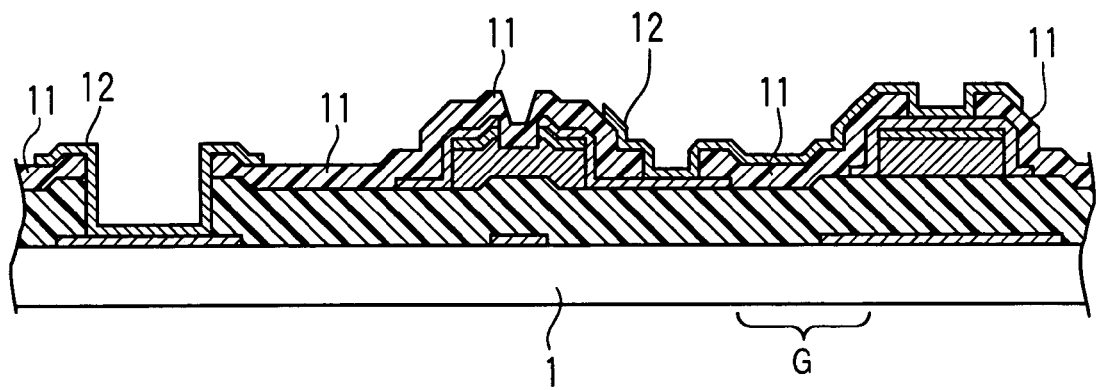

Next, as shown in FIG. 14E, a transparent conductive layer of ITO (Indium Tin Oxide) 12 having the thickness of 400 Angstroms is formed on the surface of the protective insulating film 11, the surface of the terminal pattern 2 exposed through the contact hole CT, the surface of the pattern of the source electrode PS3 exposed through the contact hole CT, and the surface of the metal layer MM5 exposed through the contact hole CT, by use of the sputtering method. Subsequently, a resist pattern (not shown) is formed in predetermined areas serving as a wiring pattern and a pixel electrode of the conductive layer 12 by use of the typical photolithography technique. Then, the conductive layer 12 is etched by use of the resist pattern (not shown) as a mask. Thus, the wiring pattern for connecting the pixel electrode and the predetermined electrode to each other is formed as the remaining portion of the conductive layer 12 resulting from the etching.

The following processes are similar to those described in the conventional example of FIG. 27. Therefore, the description is omitted.

The structure of the accumulation capacitor elements CR11 to CRnm (refer to FIG. 1) in the liquid crystal display device according to the third embodiment is different from that of the conventional example, in the fact that the a-Si layer 6 and the $n^+$ type a-Si layer 7 which are the structure materials of the thin film transistor are formed below the metal layer MM5 as the etching stopper for the auxiliary electrode PH3. Also, the structure of both of the drain electrode PD3 and the source electrode PS3 in each of the thin film transistors TR11 to TRnm is composed of the metal layer MM5 of a single layer or a lamination layer. Then, the etching process is carried out by use of one mask.

In this way, in the liquid crystal display device of the third embodiment, the a-Si layer 6 and the $n^+$ type a-Si layer 7 which are the structure materials of the thin film transistor are formed as an etching stopper below the metal layer MM5 in which the contact hole CT is formed. Therefore, even if the film defect exists in the metal layer MM5 because of the film formation defect in forming of the metal layer MM5 and the defect of the babble mixture in the photo-resist, they function as the stopper in the over-etching. Thus, there is no case that the contact hole CT proceeds up to the gate bus line pattern 4 in the area of the accumulation capacitor element. Hence, the short-circuited defect caused by the conductive layer 12 between the pixel electrode, the auxiliary electrode PH3 and the gate bus line pattern 4 is never induced. Accordingly, the point defect is never brought about.

Moreover, according to the liquid crystal display device of the third embodiment, the auxiliary electrode PH3 is located straightly above the gate bus line pattern 4. Thus, the aperture rate is never dropped except the gate bus line pattern 4. Hence, it is possible to insure the predetermined aperture rate.

In addition, according to the liquid crystal display device of the third embodiment, the patterns of the a-Si layer 6 and the $n^+$ type a-Si layer 7 functioning as the stopper in the over-etching of the opening of the contact hole CT for the accumulation capacitor elements CR11 to CRnm are formed in the necessary, minimum and predetermined area in manufacturing the liquid crystal display device. Thus, it is possible to reduce the MIS capacitance. Many portions are constituted by the metal/insulating film/metal layer. Hence, the capacitance of the predetermined charge accumulation can be insured.

In addition, according to the liquid crystal display device of the third embodiment, the patterns of the a-Si layer 6 and the $n^+$ type a-Si layer 7 functioning as the stopper are formed of the formation material of the thin film transistor. Thus, they can be formed simultaneously with the thin film transistor. Hence, the effective stopper can be obtained without requiring a new process and without increasing the manufacturing process.

The above-mentioned embodiments are described by use of the example in which the accumulation capacitor element is formed between the gate bus line pattern 4 and the auxiliary electrode PH1 (auxiliary electrodes PH2, PH3). However, the first to third embodiments can be similarly applied to a case in which a common potential line pattern different from the gate bus line pattern 4 is mounted in parallel with the gate bus line pattern 4 and then the accumulation capacitor element is formed between the common potential line pattern and the auxiliary electrode PH1 (auxiliary electrodes PH2, PH3), similarly to another conventional example described in the conventional technique.

While the embodiments of the present invention have been described in detail with reference to the attached drawings, the actual structure is not limited to the embodiment. Various design modifications and adaptations without departing from the spirit and scope of the present invention may be included in the present invention.

What is claimed is:

1. A liquid crystal display device, comprising:
    a first electrode formed on a substrate as one of two electrodes of an accumulation capacitor, said first electrode comprising a portion of a gate bus line pattern of said liquid crystal display device;
    an insulating film formed on said first electrode to cover said first electrode;
    a second electrode formed on said first electrode via said insulating film as the other electrode of said accumulation capacitor and including a first conductive film and a second conductive film formed on said first conductive film;
    a protective insulating layer formed on said second electrode and having a contact hole which is formed over said first and second electrodes, a bottom of said contact hole being defined by said second conductive film; and
    a thin film transistor comprising source and drain electrodes which are formed on said insulating film and comprise said second conductive film,
    wherein one of said first conductive film and said second conductive film comprises a layer formed of a material selected from the group consisting of Al (Aluminum), W (Tungsten), Cu (Copper), Ta (Tantalum) and TaN (Tantalum Nitride).

2. The liquid crystal display device of claim 1, wherein said first and second conductive films comprise material which is not etched when said insulating film is etched.

3. The liquid crystal display device of claim 2, wherein the other of said first conductive film and said second conductive film comprises material selected from the group consisting of Al (Aluminum), W (Tungsten), Cu (Copper), Ta (Tantalum), TaN (Tantalum Nitride), an alloy material having any of these materials as a main component, and a metal lamination film thereof.

4. The liquid crystal display device of claim 1, further comprising:
    an amorphous semiconductor film disposed between said insulating film and said second electrode.

5. The liquid crystal display device of claim 1, wherein said first and second conductive films have a same plane shape.

6. The liquid crystal display device of claim 5, further comprising:

an amorphous semiconductor film disposed between said insulating film and said second electrode.

7. The liquid crystal display device of claim 1, further comprising:
a transparent electrode connecting between one of a drain and a source of said thin film transistor and said second electrode,
wherein said thin film transistor drives a pixel capacitor.

8. The liquid crystal display device of claim 1, wherein said source and drain electrodes further comprise said first conductive film.

9. The liquid crystal display device of claim 8, wherein said first and second conductive films comprise at least one of different shapes and different thicknesses.

10. The liquid crystal display device of claim 1, wherein said first and second conductive films comprise separately-formed lamination films.

11. The liquid crystal display device of claim 1, wherein an edge of said contact hole is separated from an edge of said first conductive film by a distance, d, which comprises a sum of a marginal dimension comprising an error resulting from positional deviation and an increased distance caused by over-etching.

12. A method of manufacturing a liquid crystal display device, comprising:
forming a first electrode on a substrate as one of two electrodes of an accumulation capacitor, said first electrode comprising a portion of a gate bus line pattern of said liquid crystal display device;
forming an insulating film on said first electrode to cover said first electrode;
forming a second electrode on said first electrode via said insulating film as the other electrode of said accumulation capacitor and including a first conductive film and a second conductive film formed on said first conductive film; and
forming a protective insulating layer on said second electrode, said protective insulating layer having a contact hole which is formed over said first and second electrodes, a bottom of said contact hole being defined by said second conductive film; and
forming a thin film transistor comprising source and drain electrodes which are formed on said insulating film and comprise said second conductive film,
wherein one of said first conductive film and said second conductive film comprises a layer formed of a material selected from the group consisting of Al (Aluminum), W (Tungsten), Cu (Copper), Ta (Tantalum) and TaN (Tantalum Nitride).

13. The method of claim 12, wherein said first and second conductive films comprise material which is not etched when said insulating film is etched.

14. The method of claim 13, wherein the other of said first conductive film and said second conductive film comprises material selected from the group consisting of Al (Aluminum), W (Tungsten), Cu (Copper), Ta (Tantalum), TaN (Tantalum Nitride), an alloy material having any of these materials as a main component, and a metal lamination film thereof.

15. The method of claim 12, wherein said forming a second electrode comprises:
forming a first layer for said first conductive film on said insulating film;
forming a second layer for said second conductive film on said first conductive film; and
patterning said first and second layers such that said first and second conductive films are formed above said first electrode.

16. The method of claim 12, wherein said forming a second electrode comprises:
forming a first layer for said first conductive film on said insulating film;
patterning said first layer such that said first conductive film is formed above said first electrode;
forming a second layer for said second conductive film on said first conductive film to cover said first conductive film; and
patterning said second layer such that said second conductive film is formed above said first electrode.

17. The method of claim 12, wherein said forming a second electrode comprises:
forming a first layer for a semiconductor film on said insulating film;
forming a second layer for said first conductive film on said semiconductor film;
patterning said first and second layers such that said semiconductor film and said first conductive film are formed above said first electrode;
forming a third layer for said second conductive film on said first conductive film to cover said first conductive film; and
patterning said third layer such that said second conductive film is formed above said first electrode.

18. The method of to claim 12, further comprising:
forming said protective insulating layer on said thin film transistor and said second electrode;
forming another contact hole in said protective insulating layer to one of a drain and a source of said thin film transistor; and
forming a transparent electrode to connect said one of said drain and said source of said thin film transistor with said second electrode.

19. A liquid crystal display device, comprising:
a first electrode formed on a substrate, said first electrode comprising a portion of a gate bus line pattern of said liquid crystal display device;
an insulating film formed on said first electrode;
a first conductive film formed on said insulating film;
a second conductive film formed on said first conductive film;
a protective insulating layer formed on said second electrode and having a contact hole which is formed over said first and second electrodes, a bottom of said contact hole being defined by said second conductive film; and
a thin film transistor comprising source and drain electrodes which are formed on said insulating film and comprise said second conductive film,
wherein said first conductive film and said second conductive film form a second electrode of an accumulation capacitor, and
wherein one of said first conductive film and said second conductive film comprises a layer formed of a material selected from the group consisting of Al (Aluminum), W (Tungsten), Cu (Copper), Ta (Tantalum) and TaN (Tantalum Nitride).

20. The device of claim 19, further comprising:
a pixel electrode in contact with said second conductive film.

* * * * *